US012554202B2

(12) United States Patent
Toida

(10) Patent No.: US 12,554,202 B2
(45) Date of Patent: Feb. 17, 2026

(54) EUV LIGHT GENERATION APPARATUS AND ELECTRONIC DEVICE MANUFACTURING METHOD

(71) Applicant: Gigaphoton Inc., Tochigi (JP)

(72) Inventor: Tomoyoshi Toida, Oyama (JP)

(73) Assignee: Gigaphoton Inc., Tochigi (JP)

( * ) Notice: Subject to any disclaimer, the term of this patent is extended or adjusted under 35 U.S.C. 154(b) by 108 days.

(21) Appl. No.: 18/398,980

(22) Filed: Dec. 28, 2023

(65) Prior Publication Data
US 2024/0295824 A1 Sep. 5, 2024

(30) Foreign Application Priority Data
Feb. 24, 2023 (JP) ................. 2023-027604

(51) Int. Cl.
*G03F 7/00* (2006.01)
(52) U.S. Cl.
CPC ...... *G03F 7/70033* (2013.01); *G03F 7/70041* (2013.01); *G03F 7/70133* (2013.01); *G03F 7/70141* (2013.01); *G03F 7/702* (2013.01); *G03F 7/70525* (2013.01); *G03F 7/7085* (2013.01)

(58) Field of Classification Search
CPC ............. G03F 7/70033; G03F 7/70025; G03F 7/70041; G03F 7/7005; G03F 7/70133; G03F 7/70141; G03F 7/702; G03F 7/70525; G03F 7/7085; G03F 7/70191; G03F 7/70483–706; G03F 7/70975; G03F 7/70991; G03F 7/70605; G03F 7/70608; G03F 7/7065; G03F 7/706835; G03F 7/706839; G03F 7/706843; G03F 7/706845; G03F 7/706847; G03F 7/706849; G03F 1/70; G03F 1/82; G03F 1/84; H05G 2/00–0094
USPC ...................... 355/18, 30, 46, 52–55, 66–77; 250/492.1, 492.2, 492.22, 492.23, 493.1, 250/494.1, 503.1, 504 R, 505.1
See application file for complete search history.

(56) References Cited

U.S. PATENT DOCUMENTS

| 8,663,881 B2 | 3/2014 | Buurman et al. |
| 8,669,542 B2 | 3/2014 | Watanabe et al. |
| 10,588,211 B2 | 3/2020 | Beijsens et al. |
| 2006/0091328 A1* | 5/2006 | Kanazawa .......... G03F 7/70033 250/504 R |

(Continued)

*Primary Examiner* — Christina A Riddle
(74) *Attorney, Agent, or Firm* — Studebaker Brackett PLLC

(57) ABSTRACT

An EUV light generation apparatus includes a chamber; a target supply device supplying a first target; a laser device outputting first pulse laser light to be incident on the first target, outputting second pulse laser light to be incident on a second target, and adjusting a control parameter correlated with a shape of plasma generated by the second pulse laser light being incident on the second target; an EUV light concentrating mirror reflecting EUV light emitted from the plasma and concentrating the EUV light on an intermediate focal point; a camera imaging the EUV light and generating a picture including an image of the plasma; and a processor obtaining a value of the control parameter for improving circularity of a profile of the EUV light at the intermediate focal point using the picture and correlation information including a correlation between the shape of the plasma and the control parameter.

18 Claims, 25 Drawing Sheets

(56) References Cited

U.S. PATENT DOCUMENTS

| | | | |
|---|---|---|---|
| 2010/0140512 A1* | 6/2010 | Suganuma | G03F 7/70891 |
| | | | 250/504 R |
| 2015/0076359 A1* | 3/2015 | Bykanov | H05G 2/0088 |
| | | | 250/504 R |
| 2016/0278196 A1* | 9/2016 | Beijsens | H05G 2/0094 |

* cited by examiner

FIG. 9

| Px | 3.0 | 3.5 | 4.0 | 4.5 | 5.0 | 5.5 | 6.0 | 6.5 | 7.0 | 7.5 | 8.0 | 8.5 | 9.0 |
|---|---|---|---|---|---|---|---|---|---|---|---|---|---|
| Sx | 110.1 | 114.8 | 119.5 | 124.2 | 128.9 | 133.6 | 138.3 | 143.0 | 147.7 | 152.4 | 157.1 | 161.8 | 166.5 |
| Py | 3.0 | 3.5 | 4.0 | 4.5 | 5.0 | 5.5 | 6.0 | 6.5 | 7.0 | 7.5 | 8.0 | 8.5 | 9.0 |
| Sy | 78.5 | 85.35 | 92.2 | 99.05 | 105.9 | 112.75 | 119.6 | 126.45 | 133.3 | 140.15 | 147.0 | 153.85 | 160.7 |

| Δt | 12.5 | 22.5 | 32.5 | 42.5 | 52.5 |
|---|---|---|---|---|---|
| Px | 6.3 | 8.0 | 9.7 | 11.4 | 13.1 |

| D2 | | | |
|---|---|---|---|
| Em | 0.8 | 1.6 | 2.4 |
| Px | 6.2 | 8.4 | 10.6 |

EUV LIGHT GENERATION APPARATUS AND ELECTRONIC DEVICE MANUFACTURING METHOD

CROSS-REFERENCE TO RELATED APPLICATIONS

The present application claims the benefit of Japanese Patent Application No. 2023-027604, filed on Feb. 24, 2023, the entire contents of which are hereby incorporated by reference.

BACKGROUND

1. Technical Field

The present disclosure relates to an EUV light generation apparatus and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 10 nm or less will be required. Therefore, it is expected to develop a semiconductor exposure apparatus that combines an apparatus for generating extreme ultraviolet (EUV) light having a wavelength of about 13 nm with a reduced projection reflection optical system.

As the EUV light generation apparatus, a laser produced plasma (LPP) type apparatus using plasma generated by irradiating a target with laser light has been developed.

LIST OF DOCUMENTS

Patent Documents

Patent Document 1: U.S. Pat. No. 8,669,542
Patent Document 2: U.S. Pat. No. 10,588,211
Patent Document 3: U.S. Pat. No. 8,663,881

SUMMARY

An EUV light generation apparatus according to an aspect of the present disclosure includes a chamber; a target supply device configured to supply a first target into the chamber; a laser device configured to output first pulse laser light to be incident on the first target, output second pulse laser light to be incident on a second target generated by the first pulse laser light being incident on the first target, and be capable of adjusting a control parameter correlated with a shape of plasma generated in a plasma generation region by the second pulse laser light being incident on the second target; an EUV light concentrating mirror configured to reflect EUV light emitted from the plasma and concentrate the EUV light on an intermediate focal point; a camera configured to image the EUV light emitted from the plasma and generate a picture including an image of the plasma; and a processor configured to obtain a value of the control parameter for improving circularity of a profile of the EUV light at the intermediate focal point by using the picture and correlation information including a correlation between the shape of the plasma and the control parameter, and output the value of the control parameter to the laser device.

An electronic device manufacturing method according to an aspect of the present disclosure includes outputting EUV light generated by an EUV light generation apparatus to an exposure apparatus, and exposing a photosensitive substrate to the EUV light in the exposure apparatus to manufacture an electronic device. Here, the EUV light generation apparatus includes a chamber; a target supply device configured to supply a first target into the chamber; a laser device configured to output first pulse laser light to be incident on the first target, output second pulse laser light to be incident on a second target generated by the first pulse laser light being incident on the first target, and be capable of adjusting a control parameter correlated with a shape of plasma generated in a plasma generation region by the second pulse laser light being incident on the second target; an EUV light concentrating mirror configured to reflect the EUV light emitted from the plasma and concentrate the EUV light on an intermediate focal point; a camera configured to image the EUV light emitted from the plasma and generate a picture including an image of the plasma; and a processor configured to obtain a value of the control parameter for improving circularity of a profile of the EUV light at the intermediate focal point by using the picture and correlation information including a correlation between the shape of the plasma and the control parameter, and output the value of the control parameter to the laser device.

An electronic device manufacturing method according to an aspect of the present disclosure includes inspecting a defect of a mask by irradiating the mask with EUV light generated by an EUV light generation apparatus, selecting a mask using a result of the inspection, and exposing and transferring a pattern formed on the selected mask onto a photosensitive substrate. Here, the EUV light generation apparatus includes a chamber; a target supply device configured to supply a first target into the chamber; a laser device configured to output first pulse laser light to be incident on the first target, output second pulse laser light to be incident on a second target generated by the first pulse laser light being incident on the first target, and be capable of adjusting a control parameter correlated with a shape of plasma generated in a plasma generation region by the second pulse laser light being incident on the second target; an EUV light concentrating mirror configured to reflect the EUV light emitted from the plasma and concentrate the EUV light on an intermediate focal point; a camera configured to image the EUV light emitted from the plasma and generate a picture including an image of the plasma; and a processor configured to obtain a value of the control parameter for improving circularity of a profile of the EUV light at the intermediate focal point by using the picture and correlation information including a correlation between the shape of the plasma and the control parameter, and output the value of the control parameter to the laser device.

BRIEF DESCRIPTION OF THE DRAWINGS

Embodiments of the present disclosure will be described below merely as examples with reference to the accompanying drawings.

FIG. 9 shows another example of the first correlation information.

FIG. 11 shows another example of the second correlation information.

FIG. 17 is a view showing another example of the second correlation information according to the second embodiment.

DESCRIPTION OF EMBODIMENTS

Figure 1:
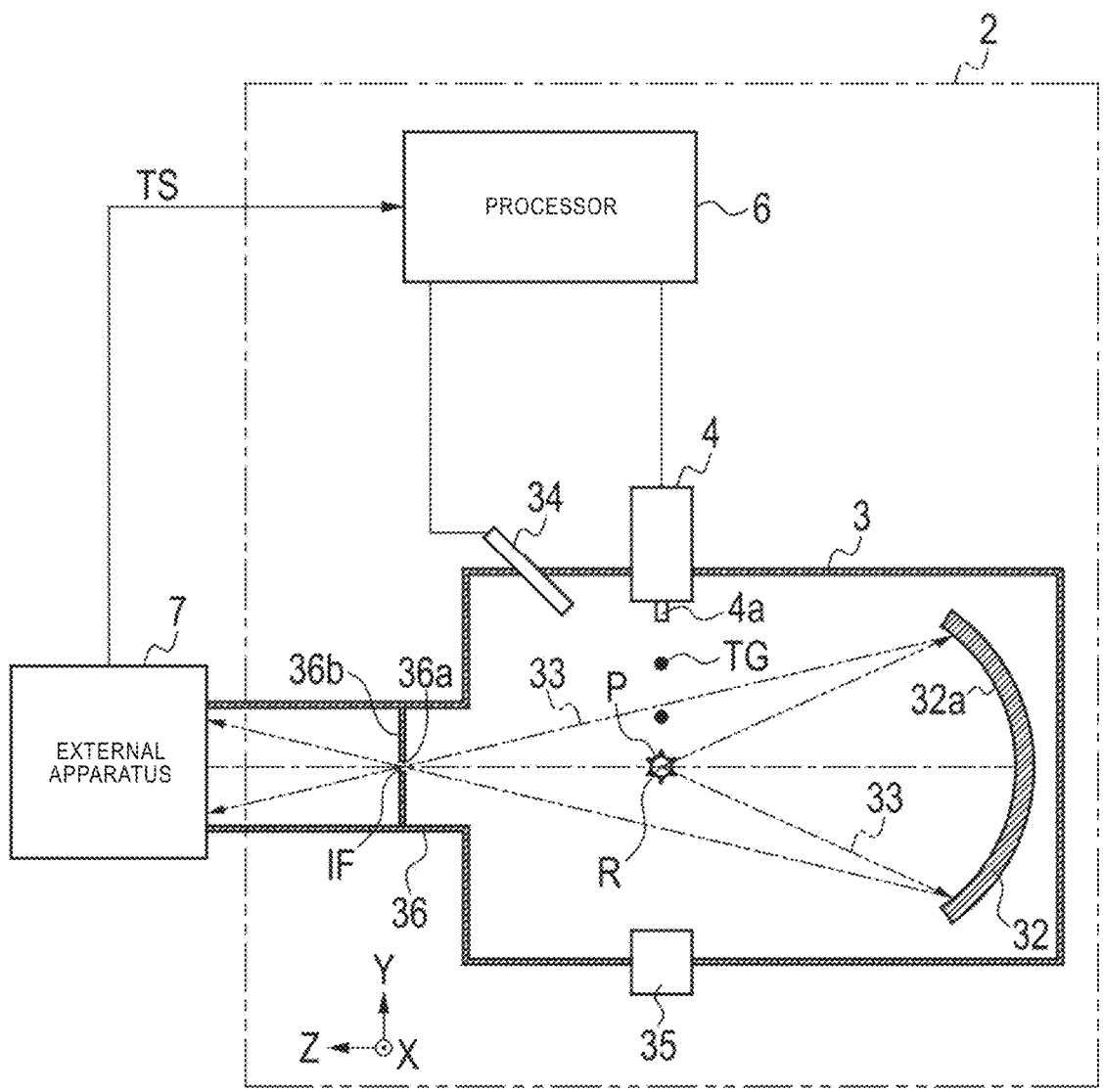
FIG. 1 is a schematic longitudinal sectional view showing the configuration of an EUV light generation apparatus according to a comparative example.

<Content>
1. EUV light generation apparatus according to comparative example
   1.1 Configuration
   1.2 Operation
2. EUV light generation apparatus according to first embodiment
   2.1 Configuration
      2.1.1 Overall configuration
      2.1.2 First correlation information
      2.1.3 Second correlation information
   2.2 Operation
   2.3 Effect
3. EUV light generation apparatus according to second embodiment
4. EUV light generation apparatus according to third embodiment
5. EUV light generation apparatus according to fourth embodiment
6. EUV light generation apparatus according to fifth embodiment
7. Modification
8. Others Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numeral, and duplicate description thereof is omitted.

Figure 2:
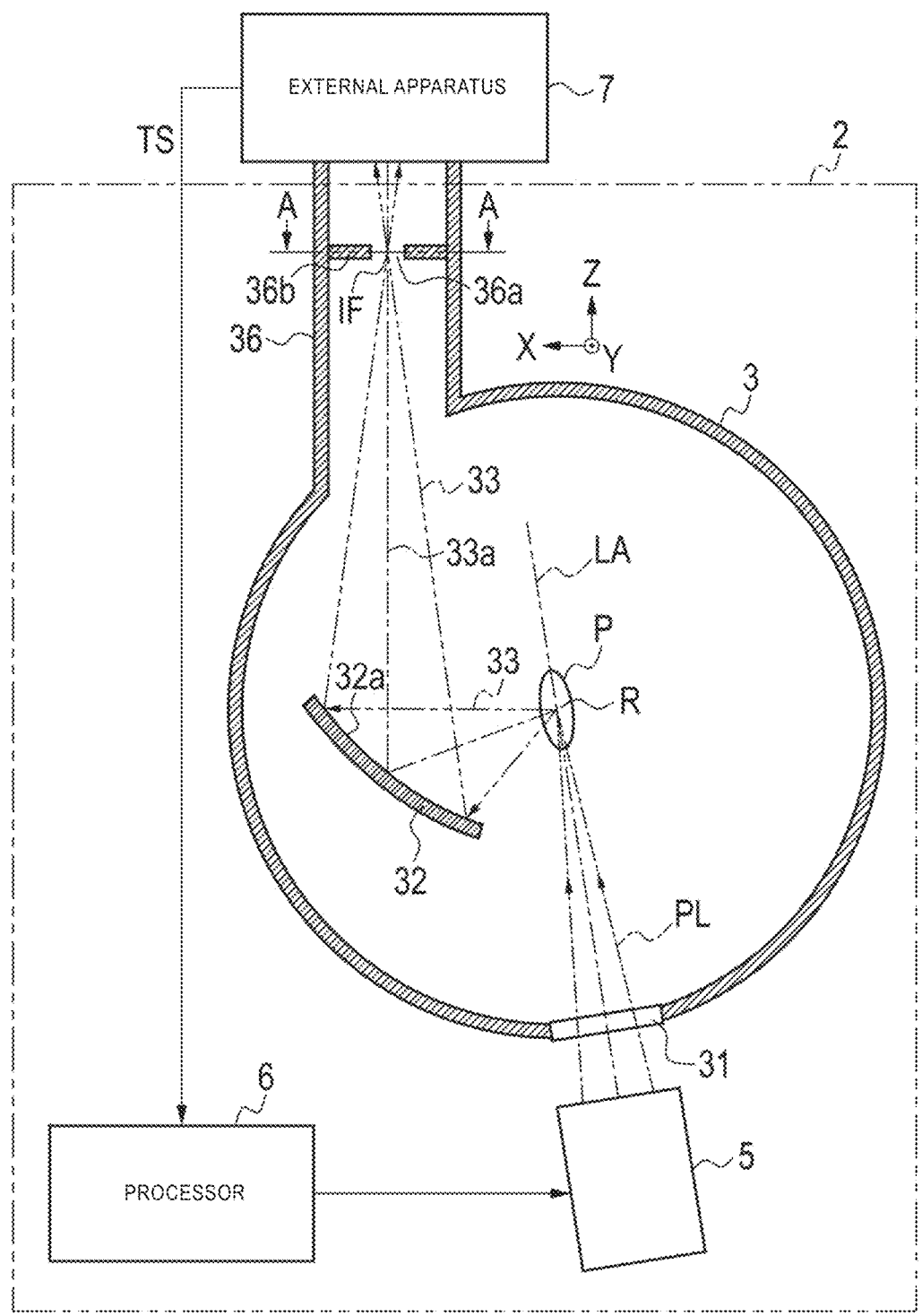
FIG. 2 is a schematic lateral sectional view showing the configuration of the EUV light generation apparatus according to the comparative example.

1. EUV Light Generation Apparatus According to Comparative Example 1.1 Configuration FIGS. 1 and 2 schematically show the configuration of an EUV light generation apparatus 2 according to a comparative example. FIG. 1 is a schematic vertical sectional view of the EUV light generation apparatus 2 taken along the vertical direction. FIG. 2 is a schematic lateral sectional view of the EUV light generation apparatus 2 taken along the horizontal direction.

The EUV light generation apparatus 2 includes a chamber 3, a target supply device 4, a laser device 5, and a processor 6. The chamber 3 is a sealable container. The target supply device 4 supplies a target TG in a droplet form into the chamber 3. The material of the target TG may include tin, terbium, gadolinium, lithium, xenon, or a combination of any two or more thereof. The target supply device 4 outputs the target TG from a nozzle 4a at a constant cycle toward a plasma generation region R located vertically below the nozzle 4a. The diameter of the target TG is 10 μm to 30 μm.

A through hole is formed in a wall of the chamber 3. The through hole is blocked by a window 31 through which pulse laser light PL output from the laser device 5 passes. An EUV light concentrating mirror 32 having a part of a spheroidal surface as a reflection surface 32a having a first focal point and a second focal point is arranged in the chamber 3. A multilayer reflection film in which molybdenum and silicon are alternately stacked is formed on a surface of the EUV light concentrating mirror 32. The EUV light concentrating mirror 32 is arranged such that the first focal point is located in the plasma generation region R and the second focal point is located at an intermediate focal point IF.

As shown in FIG. 2, the EUV light concentrating mirror 32 is an off-axis mirror having the reflection surface 32a that is a part of the spheroid surface being off the rotational symmetry axis and is asymmetric with respect to the rotational symmetry axis. The rotational symmetry axis is a straight line passing through the first focal point and the second focal point.

The EUV light concentrating mirror 32 reflects EUV light 33 emitted from the plasma P generated in the plasma generation region R, concentrates the EUV light 33 on the intermediate focal point IF, and outputs the EUV light 33 to the external apparatus 7. The external apparatus 7 performs a predetermined process using the EUV light 33. For example, the external apparatus 7 is an inspection apparatus or an exposure apparatus.

The laser device 5 is configured such that the output pulse laser light PL enters the chamber 3 through the window 31 and is incident on the target TG supplied to the plasma generation region R from the target supply device 4. Specifically, the laser device 5 includes a laser light transmission device (not shown) that transmits the pulse laser light PL, and a laser light concentrating optical system (not shown) that concentrates the pulse laser light PL transmitted by the laser light transmission device on the plasma generation region R. Hereinafter, the optical axis of laser light concentrating optical system is referred to as a laser optical axis LA. The laser optical axis LA may be non-parallel to the rotational symmetry axis.

The laser device 5 outputs prepulse laser light PPL and main pulse laser light MPL as the pulse laser light PL. Specifically, the laser device 5 includes a prepulse laser device (not shown) that outputs the prepulse laser light PPL and a main pulse laser device (not shown) that outputs the main pulse laser light MPL. For example, the prepulse laser device is a laser device using an Nd: YAG crystal, and the main pulse laser device is a laser device using an Nd: YAG crystal or a $CO_2$ laser device.

The pulse energy of the prepulse laser light PPL is smaller than the pulse energy of the main pulse laser light MPL. The laser device 5 outputs the prepulse laser light PPL and the main pulse laser light MPL in this order. Hereinafter, when there is no need to distinguish between the prepulse laser light PPL and the main pulse laser light MPL, they are simply referred to as the pulse laser light PL. Here, the prepulse laser light PPL is an example of the "first pulse laser light" according to the present disclosure. The main pulse laser light MPL is an example of the "second laser light" according to the present disclosure.

The chamber 3 is provided with a target sensor 34 and a target collection unit 35. The target sensor 34 detects at least one of the presence, trajectory, position, and velocity of the target TG. For example, the target sensor 34 detects a passage timing at which the target TG output from the target supply device 4 passes through a predetermined position on the trajectory. Here, the target sensor 34 may have an imaging function of imaging the target TG. The target collection unit 35 is arranged vertically below the target supply device 4, and collects the target TG that has passed through the plasma generation region R.

Further, the EUV light generation apparatus 2 includes a connection portion 36 providing communication between the inside of the chamber 3 and the inside of the external apparatus 7. A wall 36b in which an aperture 36a is formed is arranged in the connection portion 36. The wall 36b is arranged such that the aperture 36a is located at the intermediate focal point IF.

The processor 6 is an information processing device configured by hardware or a combination of hardware and software. For example, the processor 6 is configured by a central processing unit (CPU). The processor 6 incorporates a storage device in which a program is stored, and executes processing based on the program. Here, the storage device may be provided outside the processor 6 and connected to the processor 6.

The processor 6 controls the laser device 5, the target supply device 4, the target sensor 34, and the like. The processor 6 controls output operation of the target TG by the target supply device 4 and output operation of the pulse laser light PL by the laser device 5.

In the present disclosure, the direction in which the EUV light 33 reflected by the EUV light concentrating mirror 32 is output to the external apparatus 7 is defined as a Z direction. Further, the vertical direction is defined as a Y direction, and the direction orthogonal to the Z direction and the Y direction is defined as an X direction. The optical path axis 33a of the EUV light 33 passing through the intermediate focal point IF is parallel to the Z direction. The optical path axis 33a is a center axis of the light flux of the EUV light 33 concentrated by the EUV light concentrating mirror 32 on the intermediate focal point IF.

1.2 Operation

The operation of the EUV light generation apparatus 2 according to the comparative example will be described. First, the processor 6 controls the target supply device 4 to output the target TG at a predetermined cycle. The processor 6 may control the output timing of the target TG by the target supply device 4 based on a light emission timing signal TS input from the external apparatus 7. Each target TG output from the target supply device 4 is supplied to the plasma generation region R.

The processor 6 controls the laser device 5 to output the pulse laser light PL at a predetermined cycle so that the pulse laser light PL is incident on each target TG supplied to the plasma generation region R. The processor 6 may control the output timing of the pulse laser light PL by the laser device 5 based on the passage timing of the target TG detected by the target sensor 34.

Figure 3:
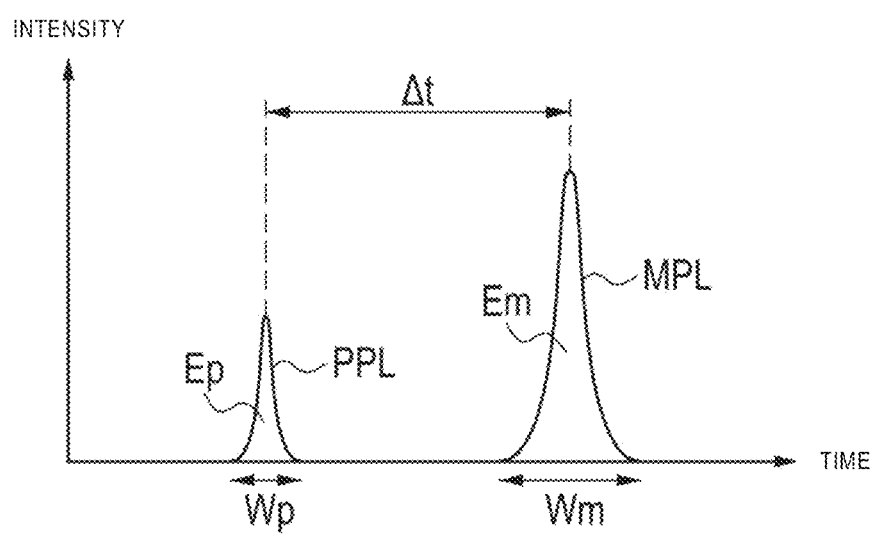
FIG. 3 is a view of an example of control parameters of a laser device.

More specifically, the processor 6 causes the laser device 5 to output the prepulse laser light PPL and the main pulse laser light MPL such that the prepulse laser light PPL and the main pulse laser light MPL are incident on each target TG. As shown in FIG. 3, the processor 6 sets, in the laser device 5, a delay time $\Delta t$ which is a time from when the prepulse laser light PPL is output to when the main pulse laser light MPL is output.

Further, the processor 6 may set a pulse energy Ep of the prepulse laser light PPL and a pulse energy Em of the main pulse laser light MPL prior to the output operation of the pulse laser light PL by the laser device 5. Further, the processor 6 may set a pulse width Wp of the prepulse laser light PPL and a pulse width Wm of the main pulse laser light MPL prior to the output operation of the pulse laser light PL by the laser device 5. Hereinafter, the pulse energy Ep of the prepulse laser light PPL is referred to as a "PPL pulse energy Ep." The pulse energy Em of the main pulse laser light MPL is referred to as an "MPL pulse energy Em." The pulse width Wp of the prepulse laser light PPL is referred to as a "PPL pulse width Wp." The pulse width Wm of the main pulse laser light MPL is referred to as an "MPL pulse width Wm."

Figure 4:
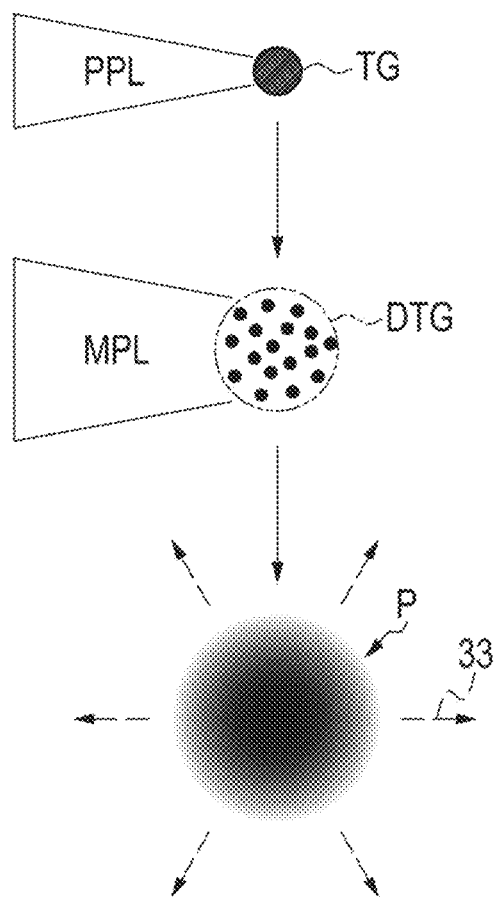
FIG. 4 is a view for explaining a target and a diffusion target.

As shown in FIG. 4, the prepulse laser light PPL is incident on the target TG. The target TG is diffused by the incidence of the prepulse laser light PPL, and becomes a mist-like diffusion target DTG of fine particles. The main pulse laser light MPL is incident on the diffusion target DTG. When the main pulse laser light MPL is incident on the diffusion target DTG, plasma P is generated, and light including the EUV light 33 is emitted from the plasma P.

The EUV light 33 thus generated in the plasma generation region R is reflected by the EUV light concentrating mirror 32, and is output to the external apparatus 7 via the intermediate focal point IF, which is the focal point of the EUV light concentrating mirror 32. The target TG is an example of the "first target" according to the present disclosure. The diffusion target DTG is an example of the "second target" according to the present disclosure.

1.3 Problem

Figure 5:
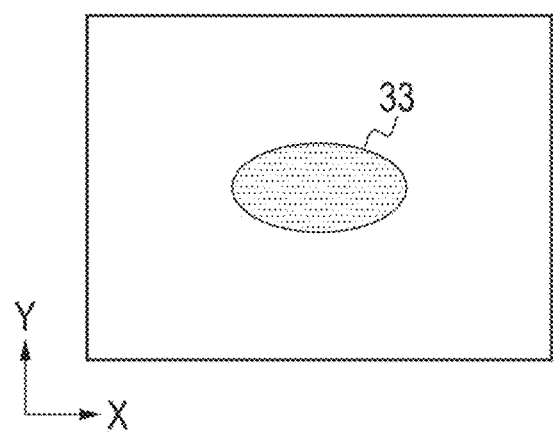
FIG. 5 is a view showing an example of a profile of EUV light at an intermediate focal point of the EUV light generation apparatus according to the comparative example.

The problem of the EUV light generation apparatus 2 according to the comparative example will be described. Since the EUV light concentrating mirror 32 is an off-axis mirror, as shown in FIG. 2, the EUV light concentrating mirror 32 collects the EUV light 33 emitted from the plasma P generated in the plasma generation region R in a direction oblique to the laser optical axis LA and concentrates the EUV light 33 on the intermediate focal point IF. Since the plasma P has a shape extending along the laser optical axis LA, the shape of the plasma P viewed from the EUV light concentrating mirror 32 is not circular. Therefore, as shown in FIG. 5, the profile of the EUV light 33 at the intermediate focal point IF is not circular, but elliptical, for example. Here, the profile of the EUV light 33 at the intermediate focal point IF refers to the intensity distribution of the EUV light 33 in a plane perpendicular to the optical path axis 33a. Hereinafter, the profile of the EUV light 33 at the intermediate focal point IF is referred to as an "IF point profile."

As described above, when the circularity of the IF point profile is low, there is a problem such as that shaping the EUV light 33 in the external apparatus 7 is difficult. Therefore, even when the EUV light concentrating mirror 32 collects the EUV light 33 emitted from the plasma P in an oblique direction with respect to the laser optical axis LA, the EUV light concentrating mirror 32 is required to output the EUV light 33 having the IF point profile with high circularity.

2. EUV Light Generation Apparatus According to First Embodiment

An EUV light generation apparatus 2a according to a first embodiment will be described. Any component same as that described above is denoted by an identical reference sign, and duplicate description thereof is omitted unless specific description is needed.

2.1 Configuration 2.1.1 Overall Configuration

Figure 6:
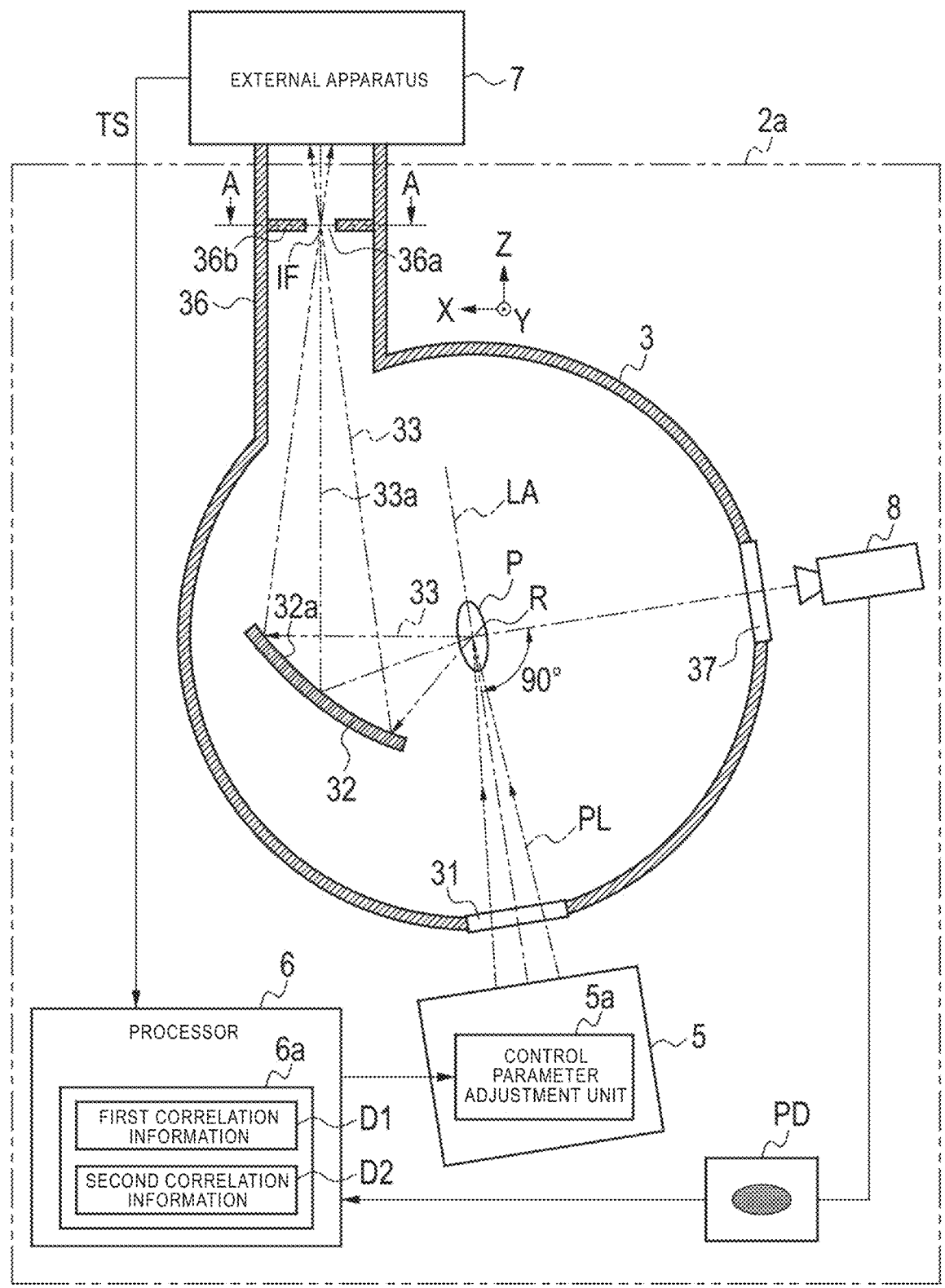
FIG. 6 is a schematic lateral view showing the configuration of the EUV light generation apparatus according to a first embodiment.

FIG. 6 schematically shows the configuration of the EUV light generation apparatus 2a according to the first embodiment. FIG. 6 is a schematic lateral sectional view of the EUV light generation apparatus 2a taken along the horizontal direction.

The EUV light generation apparatus 2a includes a camera 8 that is sensitive to the wavelength of the EUV light 33. In the present embodiment, a through hole different from the through hole blocked by the window 31 is formed in the wall of the chamber 3, and the through hole is blocked by a window 37. The camera 8 images the EUV light 33 emitted from the plasma P in the plasma generation region R, generates a picture PD including an image of the plasma P, and outputs the picture PD to the processor 6. The shape of the radiation distribution of the EUV light 33 in the plasma generation region R corresponds to the shape of the plasma P.

For example, the camera 8 includes a fluorescent plate that generates visible light in response to the EUV light 33, and an image sensor that two-dimensionally images the visible light generated by the fluorescent plate. For example, the fluorescent plate is a YAG:Ce crystal plate.

In the present embodiment, the camera 8 is arranged so as to image the plasma generation region R from a direction at an angle of 90° with respect to the laser optical axis LA. For example, the imaging direction of the camera 8 is a direction perpendicular to the laser optical axis LA and the Y direction.

The EUV light generation apparatus 2a includes a storage device 6a that stores correlation information including a correlation between the shape of the plasma P and a control parameter. For example, the correlation information indicates a correlation among the shape of the plasma P, the shape of the IF point profile, and the control parameter. In the present embodiment, the correlation information includes first correlation information D1 and second correlation information D2. The first correlation information D1 is information indicating a correlation between the shape of the plasma P and the IF point profile. The second correlation information D2 is information indicating a correlation between the shape of the plasma P and the control parameter.

The control parameter is a parameter of the laser device 5 correlated with the shape of the plasma P, and enables the shape of the plasma P to be changed. The control parameter includes any one or more of the delay time $\Delta t$, the PPL pulse energy Ep, the MPL pulse energy Em, the PPL pulse width Wp, and the MPL pulse width Wm.

In the present embodiment, the laser device 5 includes a control parameter adjustment unit 5a for adjusting the above-described control parameters. The control parameter adjustment unit 5a is a controller that adjusts a control parameter by controlling at least one of the prepulse laser device and the main pulse laser device.

The processor 6 estimates the shape of the IF point profile based on the picture PD output from the camera 8, obtains the value of the control parameter for improving the circularity of the IF point profile based on the estimated shape of the IF point profile, and outputs the value to the laser device 5. As will be described in detail later, the processor 6 obtains the value of the control parameter for improving the circularity of the IF point profile by using the first correlation information D1 and the second correlation information D2. Other configurations of the EUV light generation apparatus 2a according to the present embodiment are similar to those of the EUV light generation apparatus 2 according to the comparative example.

2.1.2 First Correlation Information

Figure 7:
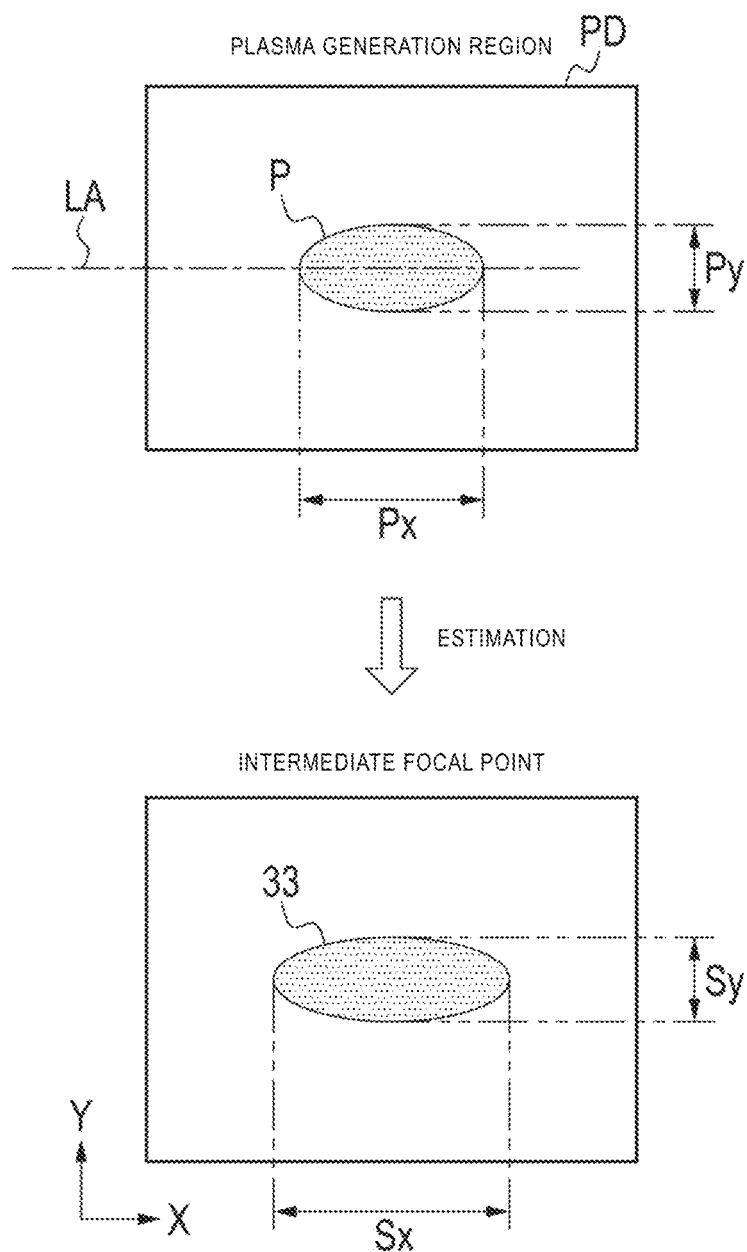
FIG. 7 is a view for explaining a process of estimating a shape of a EUV light radiation distribution at the intermediate focal point from an image of the EUV light radiation distribution shown in a picture.

Description will be provided on the first correlation information D1. As shown in FIG. 7, the first correlation information D1 is information for estimating the shape of the IF point profile from the image of the plasma P included in the picture PD. By assuming that the plasma P is a spheroid having the laser optical axis LA as the rotational symmetry axis, a length Px and a diameter Py of the plasma P can be measured based on the picture PD. The length Px is a length of the plasma P in the direction of the laser optical axis LA. The diameter Py is a diameter of the plasma P in a plane perpendicular to the laser optical axis LA. In the present embodiment, since the camera 8 images the plasma generation region R from a direction at an angle of 90° with respect to the laser optical axis LA, the major axis and the minor axis of the image of the elliptical plasma P correspond to the length Px and the diameter Py of the plasma P.

The length Px of the plasma P corresponds to a size Sx of the IF point profile in the X direction. The diameter Py of the plasma P corresponds to a size Sy of the IF point profile in the Y direction. Hereinafter, the size Sx in the X direction is referred to as an "X-direction size Sx", and the size Sy in the Y direction is referred to as a "Y-direction size Sy." The X-direction size Sx and the Y-direction size Sy represent the shape of the IF point profile.

The first correlation information D1 defines the relationship between the length Px and the diameter Py of the plasma P and the X-direction size Sx and the Y-direction size Sy of the IF point profile.

Figure 8:
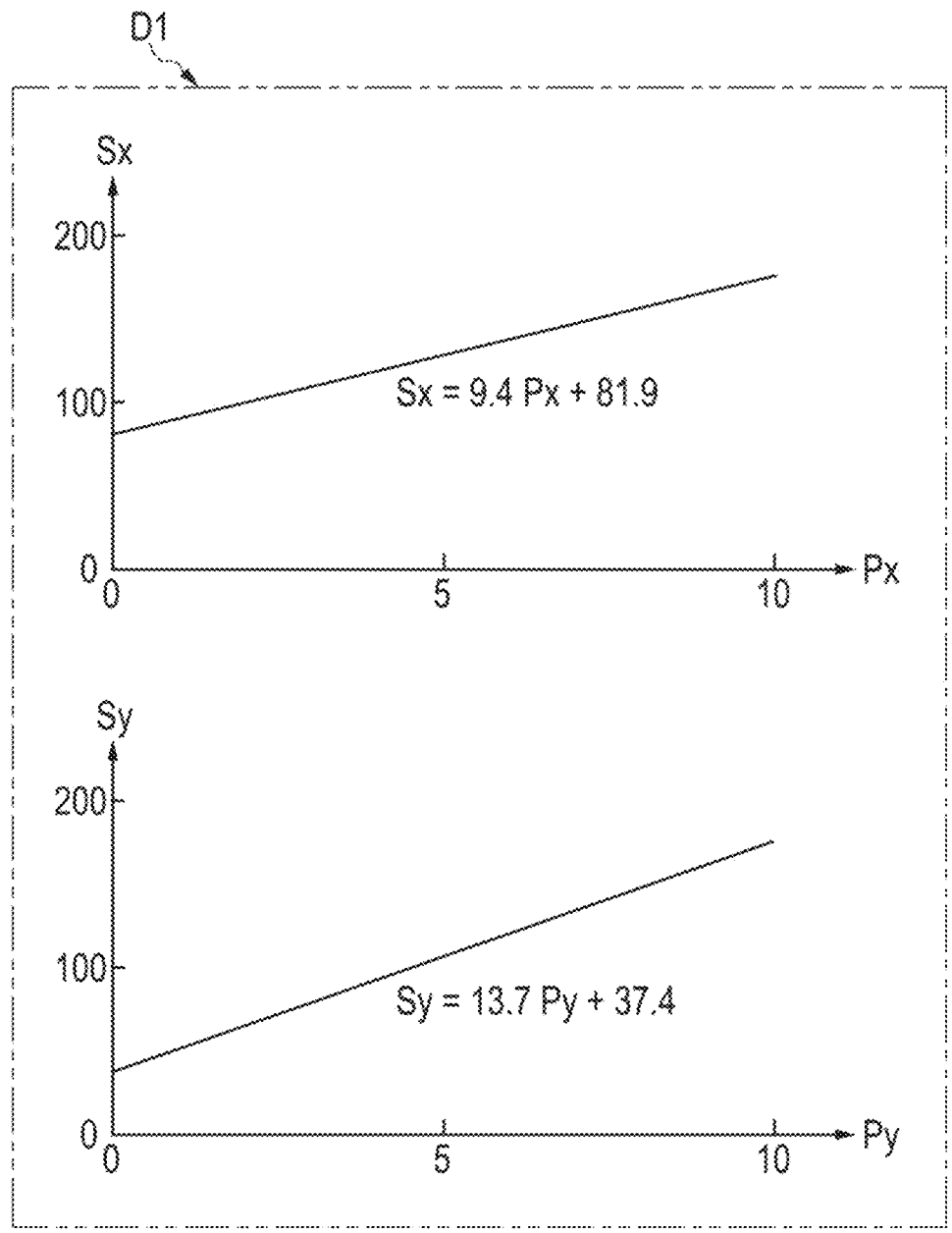
FIG. 8 shows an example of a first correlation information.

FIG. 8 shows an example of the first correlation information D1. In the example shown in FIG. 8, the first correlation information D1 is expressed by functions of following expression (1) and expression (2). Here, the units of the length Px and the diameter Py are arbitrary units.

$$Sx = 9.4Px + 81.9 \quad (1)$$

$$Sy = 13.7Py + 37.4 \quad (2)$$

The expression (1) represents the relationship between the length Px and the X-direction size Sx when Py=7. The expression (2) represents the relationship between the diameter Py and the Y-direction size Sy when Px=5.

The processor 6 estimates the X-direction size Sx and the Y-direction size Sy of the IF point profile by substituting the length Px and the diameter Py of the plasma P measured based on the picture PD into the above expressions (1) and (2), respectively.

The first correlation information D1 may be obtained by either actual measurement or simulation. The above expressions (1) and (2) are an example of the first correlation information D1 obtained by simulation.

An example of a procedure of creating the first correlation information D1 by simulation will be described. First, the shape of the plasma P is assumed to be a spheroid, and Abel transformation is performed on the picture PD to create virtual three-dimensional plasma. Next, an image formed at the intermediate focal point IF by the light emitted from the created three-dimensional plasma and reflected by the EUV light concentrating mirror 32 is obtained by ray tracing calculation. Then, the correlation between the shape of the image formed at the intermediate focal point IF and the shape of the image of the plasma P included in the picture PD is obtained, and the information indicating the obtained correlation is set as the first correlation information D1.

FIG. 9 shows another example of the first correlation information D1. The first correlation information D1 shown in FIG. 9 is a data table in which the above expressions (1) and (2) are tabulated. The processor 6 may estimate the shape of the IF point profile using the data table. Here, numerical values that do not exist in the data table may be acquired by performing a complementation process or the like.

The first correlation information D1 is not limited to the above-described examples as long as defining the correlation between the shape of the plasma P and the shape of the IF point profile.

2.1.3 Second Correlation Information

Description will be provided on the second correlation information D2. In the present embodiment, the second correlation information D2 defines a correlation between the shape of the plasma P and the delay time Δt. The delay time Δt is an example of the control parameter of the laser device 5.

Figure 10:
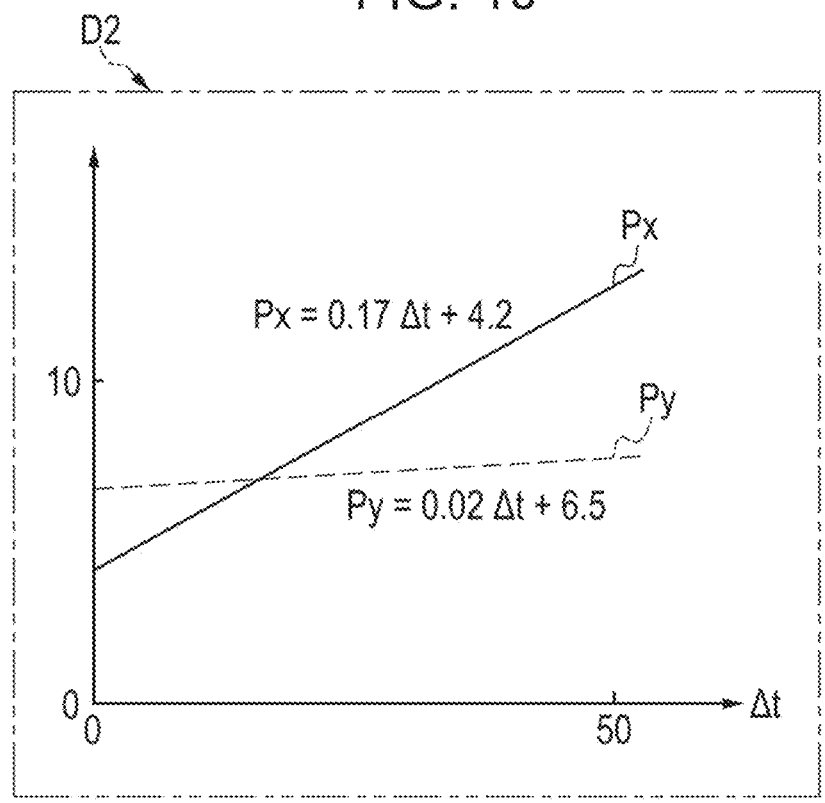
FIG. 10 shows an example of a second correlation information.

FIG. 10 shows an example of the second correlation information D2. In FIG. 10, the vertical axis represents the dimension, and the horizontal axis represents the delay time Δt. As shown in FIG. 10, the length Px of the plasma P has high dependency on the delay time Δt, and becomes longer as the delay time Δt becomes longer. On the other hand, the diameter Py of the plasma P has low dependency on the delay time Δt and hardly changes even when the delay time Δt is changed. This means that, by adjusting the delay time Δt, the shape of the plasma P can be changed and the shape of the IF point profile can be changed. Therefore, in the present embodiment, the information indicating the correlation between the length Px of the plasma P and the delay time Δt is referred to as the second correlation information D2.

In the example shown in FIG. 10, the second correlation information D2 is expressed by a function of following expression (3). Here, the units of the length Px and the delay time Δt are arbitrary units.

$$Px = 0.17\Delta t + 4.2 \quad (3)$$

When the circularity of the IF point profile estimated by using the first correlation information D1 is small, the processor 6 obtains the delay time Δt with which the circularity of the IF point profile is improved by using the first correlation information D1 and the second correlation information D2. For example, the circularity is defined by a differential value between the X-direction size Sx and the Y-direction size Sy. The smaller the differential value is, the higher the circularity is. Therefore, when the differential value is large, the processor 6 obtains the length Px of the plasma P for setting the differential value to zero by using the first correlation information D1, and obtains the value of the delay time Δt by substituting the obtained length Px of the plasma P into the above expression (3) as the second correlation information D2. Here, the value of the delay time Δt may be obtained by using the Y-direction size Sy as a target value of the X-direction size Sx.

Similarly to the first correlation information D1, the second correlation information D2 may be obtained by either actual measurement or simulation. The above expression (3) is an example of the second correlation information D2 obtained through experiment.

Figure 11:
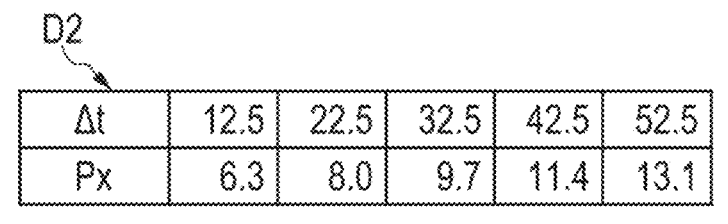

FIG. 11 shows another example of the second correlation information D2. The second correlation information D2 shown in FIG. 11 is a data table in which the above expression (3) is tabulated. The processor 6 may obtain the delay time Δt with which the circularity of the IF point profile is improved by using the data table. Here, numerical values that do not exist in the data table may be acquired by performing a complementation process or the like.

In addition to the dependency of the length Px of the plasma P on the delay time Δt, the processor 6 may obtain the value of the delay time Δt with which the circularity of the IF point profile is improved in consideration of the dependency of the diameter Py of the plasma P on the delay time Δt.

The second correlation information D2 is not limited to the above-described examples as long as defining the correlation between the shape of the plasma P and the control parameter.

2.2 Operation

The operation of the EUV light generation apparatus 2a according to the first embodiment will be described. The operation of the EUV light generation apparatus 2a according to the present embodiment is similar to the operation of the EUV light generation apparatus 2 according to the comparative example except that profile adjustment control for improving the circularity of the IF point profile is additionally performed.

Figure 12:
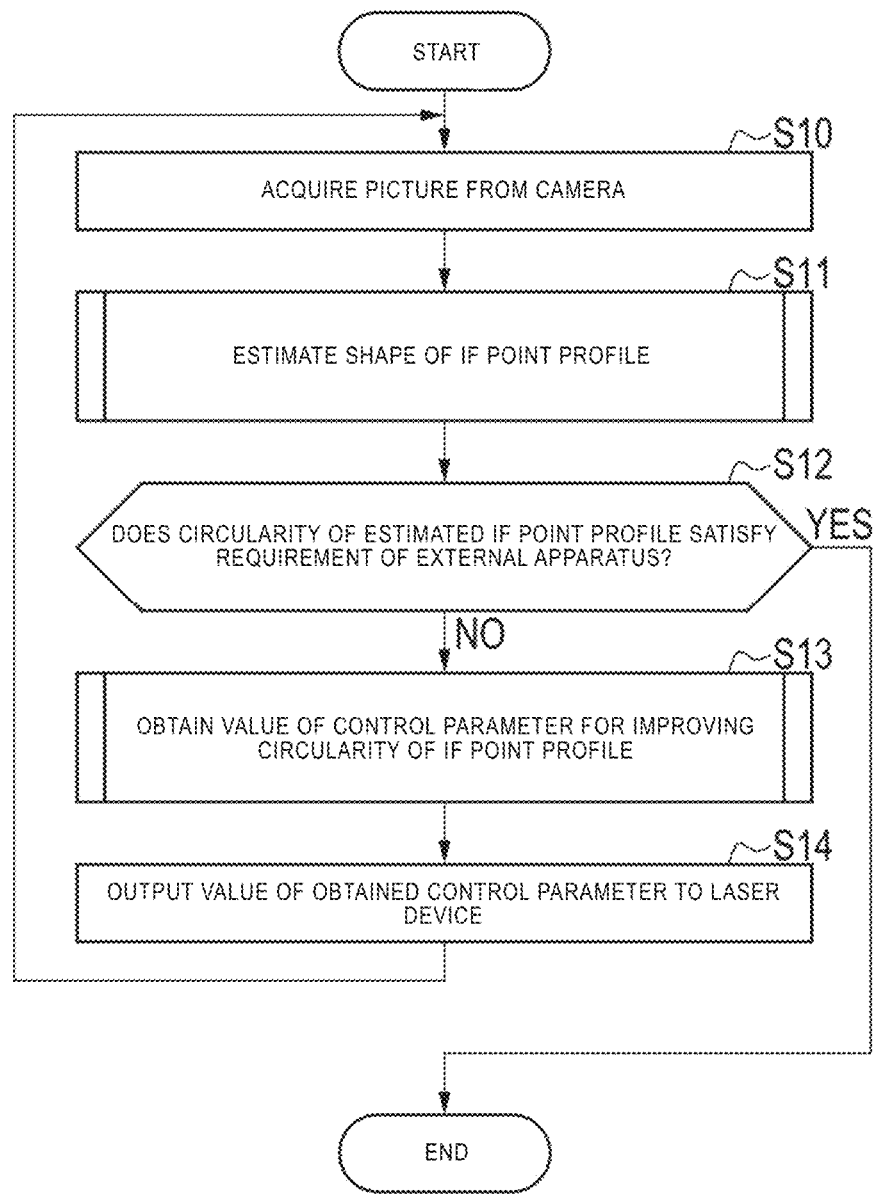
FIG. 12 is a view showing a flow of profile adjustment control.

FIG. 12 shows a flow of the profile adjustment control. First, the processor 6 acquires the picture PD from the camera 8 (step S10). Here, the camera 8 may constantly perform imaging. The camera 8 may perform the imaging intermittently or irregularly. When the imaging is irregularly performed, for example, the processor 6 causes the camera 8 to perform the imaging by instructing the imaging timing to the camera 8 based on the passage timing of the target TG detected by the target sensor 34, and acquires the picture PD output by the camera 8.

Next, the processor 6 estimates the shape of the IF point profile based on the picture PD (step S11). The processor 6 determines whether or not the circularity of the estimated IF point profile satisfies the requirement of the external apparatus 7 (step S12). Here, the required circularity may be different depending on the type of the external apparatus 7.

When the processor 6 determines that the circularity of the estimated IF point profile does not satisfy the requirement of the external apparatus 7 (step S12:NO), the processor 6 obtains the value of the control parameter for improving the circularity of the IF point profile (step S13). Then, the processor 6 outputs the obtained value of the control parameter to the laser device 5 (step S14). The control parameter adjustment unit 5a of the laser device 5 adjusts the control parameter to be the value output from the processor 6.

Thereafter, the processor 6 returns the processing to step S10. The processor 6 repeatedly executes steps S10 to S14 until the circularity of the estimated IF point profile is determined to satisfy the requirement of the external apparatus 7. When the processor 6 determines that the circularity of the estimated IF point profile satisfies the requirement of the external apparatus 7 (step S12: YES), the processor 6 ends the processing.

Figure 13:
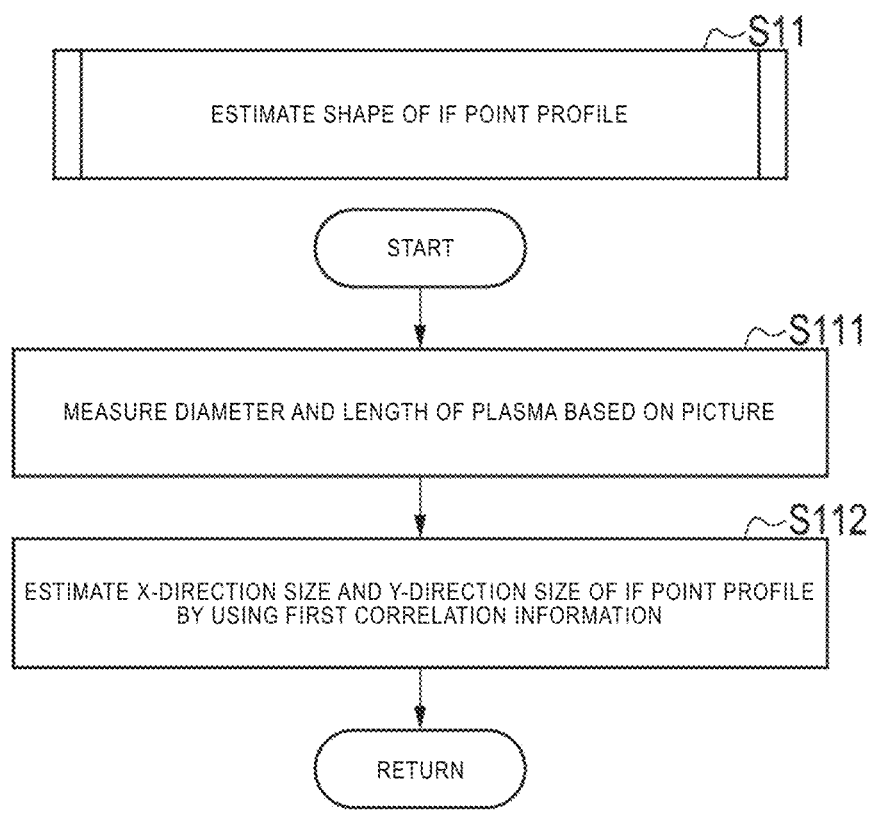
FIG. 13 is a view specifically explaining processes of step S11 in FIG. 12.

FIG. 13 specifically explains processes of step S11 in FIG. 12. In step S11, the processor 6 measures the length Px and the diameter Py of the plasma P based on the picture PD (step S111). Next, the processor 6 estimates the X-direction size Sx and the Y-direction size Sy of the IF point profile by using the first correlation information D1 (step S112). For example, the processor 6 estimates the X-direction size Sx and the Y-direction size Sy by substituting the length Px and the diameter Py measured in step S111 into the above expressions (1) and (2), respectively.

Figure 14:
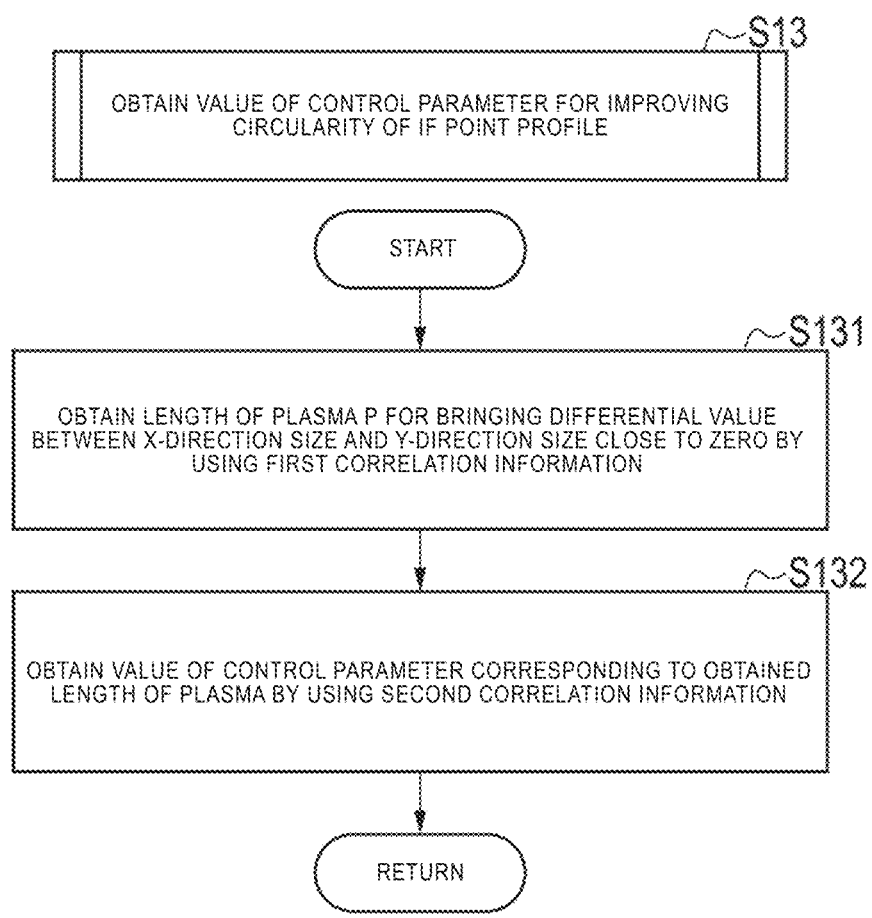
FIG. 14 is a view specifically explaining processes of step S13 in FIG. 12.

FIG. 14 specifically explains processes of step S13 in FIG. 12. In step S13, the processor 6 obtains the length Px of the plasma P for bringing the differential value between the X-direction size Sx and the Y-direction size Sy close to zero by using the first correlation information D1 (step S131). Next, the processor 6 obtains the value of the control parameter corresponding to the obtained length Px of the plasma P by using the second correlation information D2 (step S132). For example, the processor 6 calculates the delay time Δt by substituting the obtained length Px of the plasma P into the above expression (3).

2.3 Effect

The EUV light generation apparatus 2a according to the present embodiment obtains the value of the control parameter for improving the circularity of the IF point profile based on the picture PD obtained by imaging the plasma generation region R, and outputs the value to the laser device 5. Therefore, even when the EUV light 33 emitted from the plasma P in a direction oblique to the laser optical axis LA is collected by the EUV light concentrating mirror 32 and concentrated on the intermediate focal point IF, the circularity of the IF point profile can be improved.

Further, the EUV light generation apparatus 2a according to the present embodiment can perform the profile adjustment control for improving the circularity of the IF point profile during the operation of generating the EUV light 33.

3. EUV Light Generation Apparatus According to Second Embodiment

Next, description will be provided on the EUV light generation apparatus 2a according to a second embodiment. In the EUV light generation apparatus 2a according to the present embodiment, the control parameter for improving the circularity of the IF point profile is the MPL pulse energy Em, and the second correlation information D2 is information indicating the correlation between the shape of the plasma P and the MPL pulse energy Em. Other configurations of the EUV light generation apparatus 2a according to the present embodiment are similar to those of the EUV light generation apparatus 2a according to the first embodiment.

Figure 15:
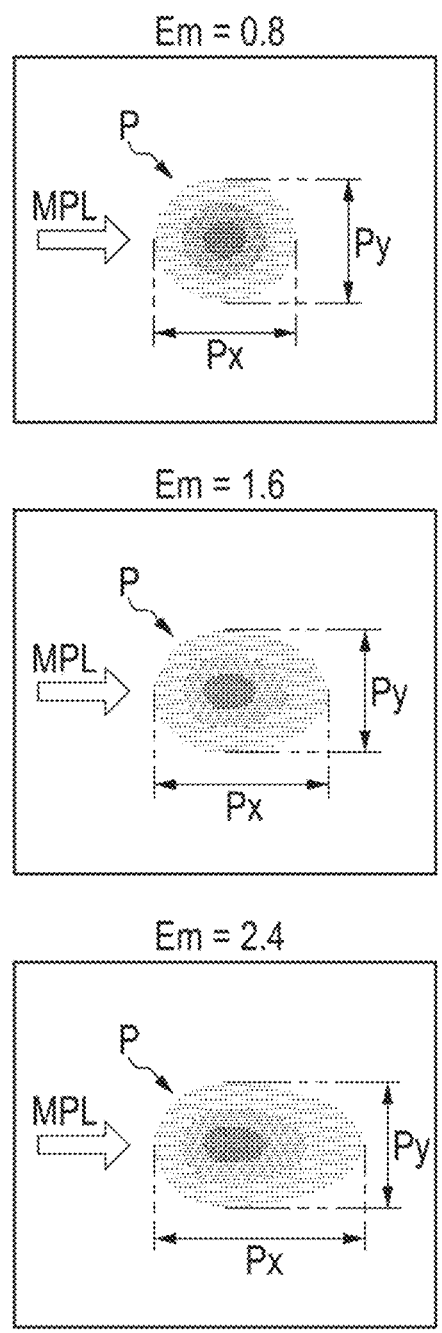
FIG. 15 is a view showing a change in the shape of plasma when an MPL pulse energy is changed.

FIG. 15 shows a change in the shape of the plasma P when the MPL pulse energy Em is changed. The inventor of the present application has confirmed through experiment that, when the MPL pulse energy Em is changed, the length Px of the plasma P changes more significantly than the diameter Py. Therefore, the MPL pulse energy Em is the control parameter that enables the shape of the plasma P to be changed.

Figure 16:
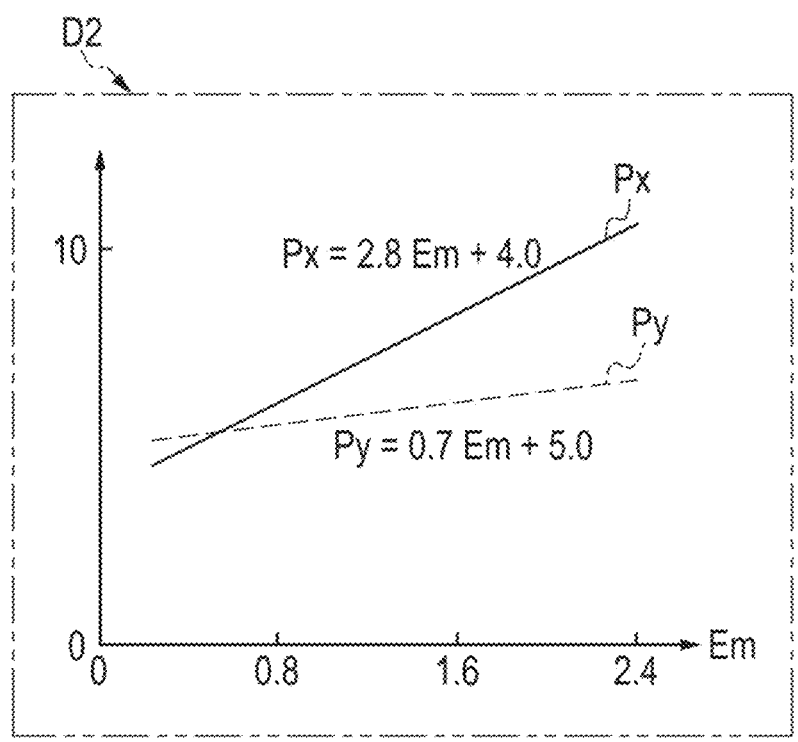
FIG. 16 is a view showing an example of the second correlation information according to a second embodiment.

FIG. 16 shows an example of the second correlation information D2 according to the second embodiment. In FIG. 16, the vertical axis represents the dimension, and the horizontal axis represents the MPL pulse energy Em. In the example shown in FIG. 16, the second correlation information D2 is expressed by a function of following expression (4). Here, the unit of the MPL pulse energy Em is an arbitrary unit.

$$Px = 2.8Em + 4.0 \qquad (4)$$

Figure 17:
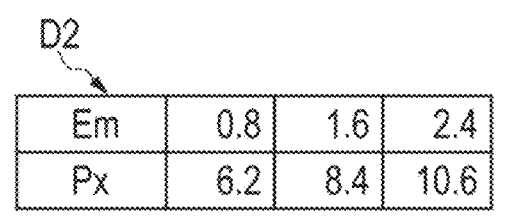

FIG. 17 shows another example of the second correlation information D2 according to the second embodiment. The second correlation information D2 shown in FIG. 17 is a data table in which the above expression (4) is tabulated.

In the present embodiment, the processor 6 obtains the value of the MPL pulse energy Em with which the circularity of the IF point profile is improved by using the second correlation information D2. In addition to the dependency of the length Px of the plasma P on the MPL pulse energy Em, the processor 6 may obtain the MPL pulse energy Em in consideration of the dependency of the diameter Py of the plasma P on the MPL pulse energy Em. In the second embodiment as well, the same effects as in the first embodiment can be obtained.

4. EUV Light Generation Apparatus According to Third Embodiment

Next, description will be provided on the EUV light generation apparatus 2a according to a third embodiment. In the EUV light generation apparatus 2a according to the present embodiment, the control parameter for improving the circularity of the IF point profile is the MPL pulse width Wm, and the second correlation information D2 is information indicating the correlation between the shape of the plasma P and the MPL pulse width Wm. Other configurations of the EUV light generation apparatus 2a according to the present embodiment are similar to those of the EUV light generation apparatus 2a according to the first embodiment.

Figure 18:
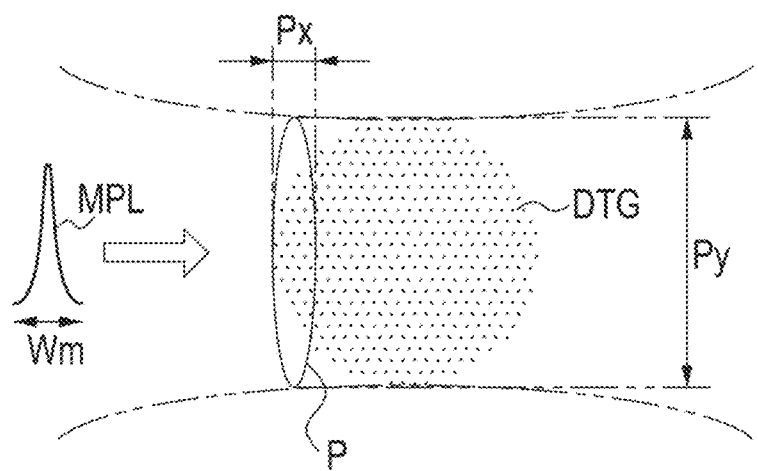
FIG. 18 is a view schematically showing the shape of the plasma generated when an MPL pulse width is short.
Figure 19:
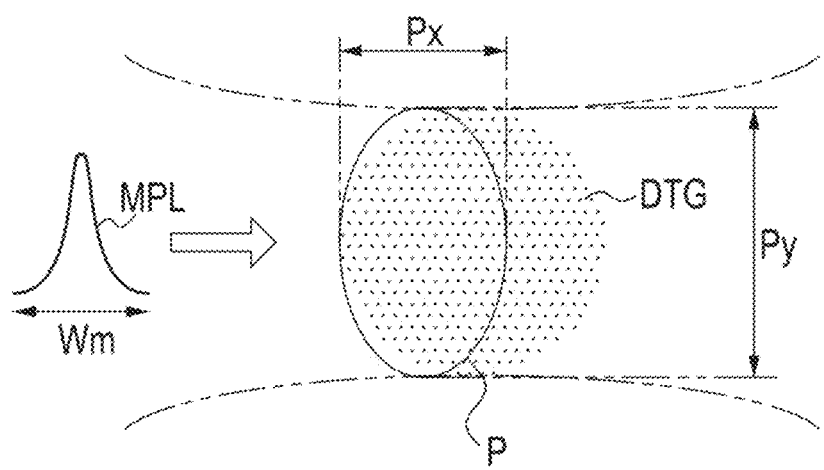
FIG. 19 is a view schematically showing the shape of the plasma generated when the MPL pulse width is long.

FIGS. 18 and 19 schematically show a change in the shape of the plasma P when the MPL pulse width Wm is changed. FIG. 18 schematically shows the shape of the plasma P generated when the MPL pulse width Wm is short. FIG. 19 schematically shows the shape of the plasma P generated when the MPL pulse width Wm is long. When the MPL pulse width Wm is changed, it is considered that the length Px of the plasma P changes more significantly than the diameter Py. This is because the diameter Py of the plasma P generated by irradiating the diffusion target DTG with the main pulse laser light MPL is substantially equal to the irradiation diameter of the main pulse laser light MPL, and the length Px of the plasma P is considered to be positively correlated with the MPL pulse width Wm. The reason is as follows.

It is assumed that the diffusion target DTG is heated from its surface at the time of irradiation with the main pulse laser light MPL. When the MPL pulse width Wm is short, it is considered that the diffusion target DTG hardly changes from the start to the end of the irradiation with the main pulse laser light MPL. Therefore, the main pulse laser light MPL does not penetrate deeply into the diffusion target DTG, and the plasma P is formed on the surface of the diffusion target DTG, so that the length Px of the plasma P is short.

On the other hand, when the MPL pulse width Wm is long, the density distribution of the diffusion target DTG changes during the irradiation with the main pulse laser light MPL. Specifically, the diffusion target DTG is attenuated from its surface by thermal expansion. As the density of the diffusion target DTG decreases, the main pulse laser light MPL penetrates deeper into the diffusion target DTG and heats the diffusion target DTG in the temporally later part of the pulse width Wm of the main pulse laser light MPL. Thus, the length Px of the plasma P is increased.

Figure 20:
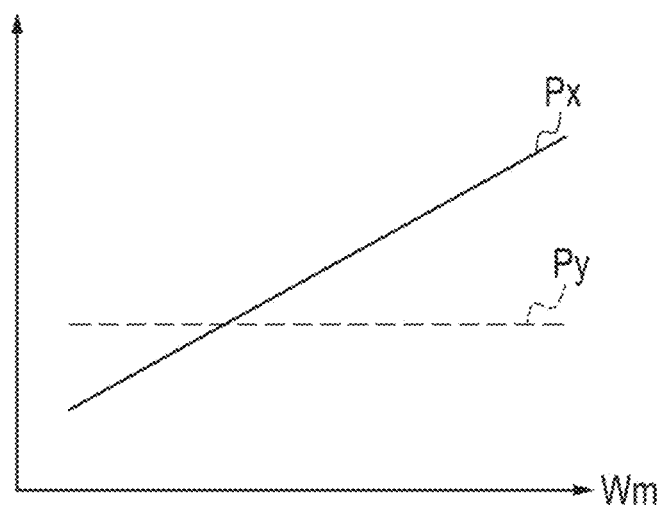
FIG. 20 is a view schematically showing a change in a diameter and a length of the plasma when the MPL pulse width is changed.

Therefore, as schematically shown in FIG. 20, when the MPL pulse width Wm is changed, it is considered that the length Px of the plasma P changes more significantly than the diameter Py. In FIG. 20, the vertical axis represents the dimension, and the horizontal axis represents the pulse width Wm.

In the present embodiment, the processor 6 obtains the value of the MPL pulse width Wm with which circularity of the IF point profile is improved by using the second correlation information D2. The second correlation information D2 is a function or a data table as in the first embodiment. In the third embodiment as well, the same effects as in the first embodiment can be obtained.

5. EUV Light Generation Apparatus According to Fourth Embodiment

Next, description will be provided on the EUV light generation apparatus 2a according to a fourth embodiment. In the EUV light generation apparatus 2a according to the present embodiment, the control parameter for improving the circularity of the IF point profile is the PPL pulse energy Ep, and the second correlation information D2 is information indicating the correlation between the shape of the plasma P and the PPL pulse energy Ep. Other configurations of the EUV light generation apparatus 2a according to the present embodiment are similar to those of the EUV light generation apparatus 2a according to the first embodiment.

Figure 21:
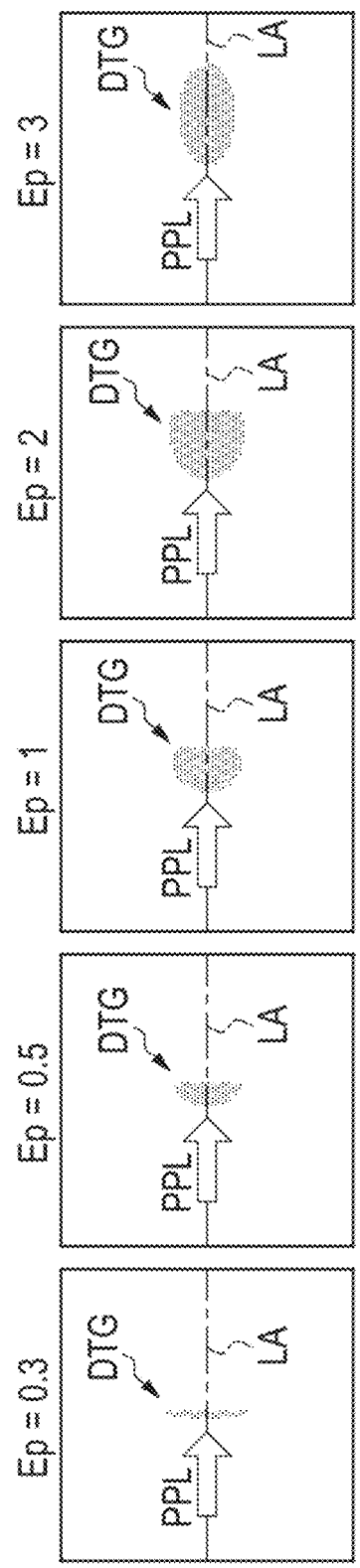
FIG. 21 is a view schematically showing a change in the shape of the diffusion target when a PPL pulse energy is changed.

FIG. 21 schematically shows a change in the shape of the diffusion target DTG when the PPL pulse energy Ep is changed. The unit of the PPL pulse energy Ep shown in FIG. 21 is an arbitrary unit. The inventor of the present application has confirmed through experiment that, when the PPL pulse energy Ep is changed, the length of the diffusion target DTG in the direction of the laser optical axis LA changes more significantly than the diameter.

The diffusion target DTG also shows a change in the shape similar to that of FIG. 21 when the delay time $\Delta t$ is changed. Therefore, it is considered that the same effect as in the case in which the delay time $\Delta t$ is changed can be obtained also in the case in which the PPL pulse energy Ep is changed. That is, when the PPL pulse energy Ep is changed, it is considered that the length Px of the plasma P changes more significantly than the diameter Py.

In the present embodiment, the processor 6 obtains the value of the PPL pulse energy Ep with which circularity of the IF point profile is improved by using the second correlation information D2. The second correlation information D2 is a function or a data table as in the first embodiment. In the fourth embodiment as well, the same effects as in the first embodiment can be obtained.

6. EUV Light Generation Apparatus According to Fifth Embodiment

Next, description will be provided on the EUV light generation apparatus 2a according to a fifth embodiment. In the EUV light generation apparatus 2a according to the present embodiment, the control parameter for improving the circularity of the IF point profile is the PPL pulse width Wp, and the second correlation information D2 is information indicating the correlation between the shape of the plasma P and the PPL pulse width Wp. Other configurations of the EUV light generation apparatus 2a according to the present embodiment are similar to those of the EUV light generation apparatus 2a according to the first embodiment.

Figure 22:
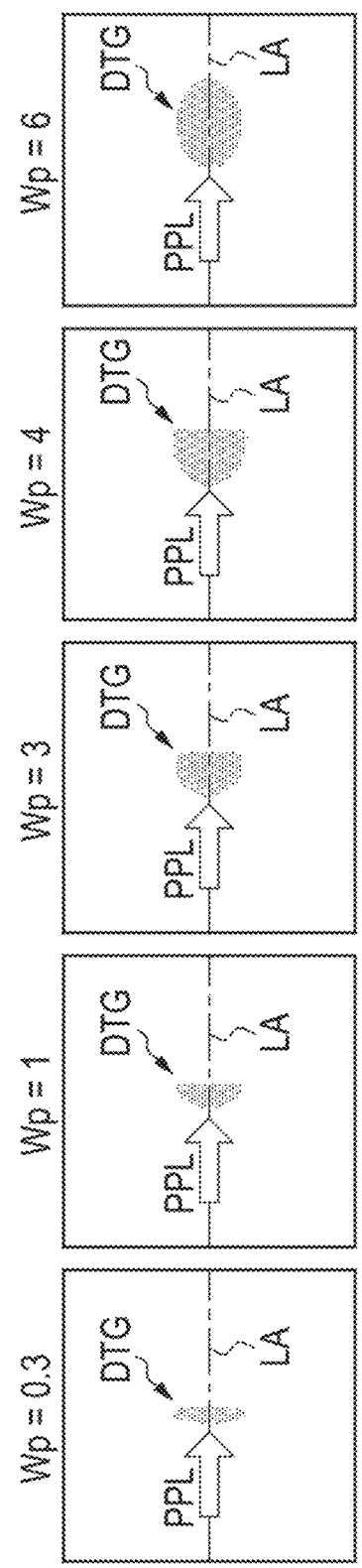
FIG. 22 is a view schematically showing a change in the shape of the diffusion target when a PPL pulse width is changed.

FIG. 22 schematically shows a change in the shape of the diffusion target DTG when the PPL pulse width Wp is changed. The unit of PPL pulse width Wp shown in FIG. 22 is an arbitrary unit. The inventor of the present application has confirmed through experiment that, when the PPL pulse width Wp is changed, the length of the diffusion target DTG in the direction of the laser optical axis LA changes more significantly than the diameter.

The diffusion target DTG also shows a change in the shape similar to that of FIG. 22 when the delay time $\Delta t$ is changed. Therefore, it is considered that the same effect as in the case in which the delay time $\Delta t$ is changed can be obtained also in the case in which the PPL pulse width Wp is changed. That is, when the PPL pulse width Wp is changed, it is considered that the length Px of the plasma P changes more significantly than the diameter Py.

In the present embodiment, the processor 6 obtains the value of the PPL pulse width Wp with which circularity of the IF point profile is improved by using the second correlation information D2. The second correlation information D2 is a function or a data table as in the first embodiment.

In the fifth embodiment as well, the same effects as in the first embodiment can be obtained.

7. Modification

Next, description will be provided on modifications of the first to fifth embodiments. In the first to fifth embodiments, the camera 8 is arranged to image the plasma generation region R from a direction at an angle of 90° with respect to the laser optical axis LA, but the arrangement of the camera 8 is not limited thereto. It is only required for the camera 8 to be capable of acquiring the picture PD that enables the correlation between the shape of the plasma P and the shape of the IF point profile to be obtained. The camera 8 may be arranged to image the plasma generation region R from a direction at an angle other than 90° with respect to the laser optical axis LA.

Figure 23:
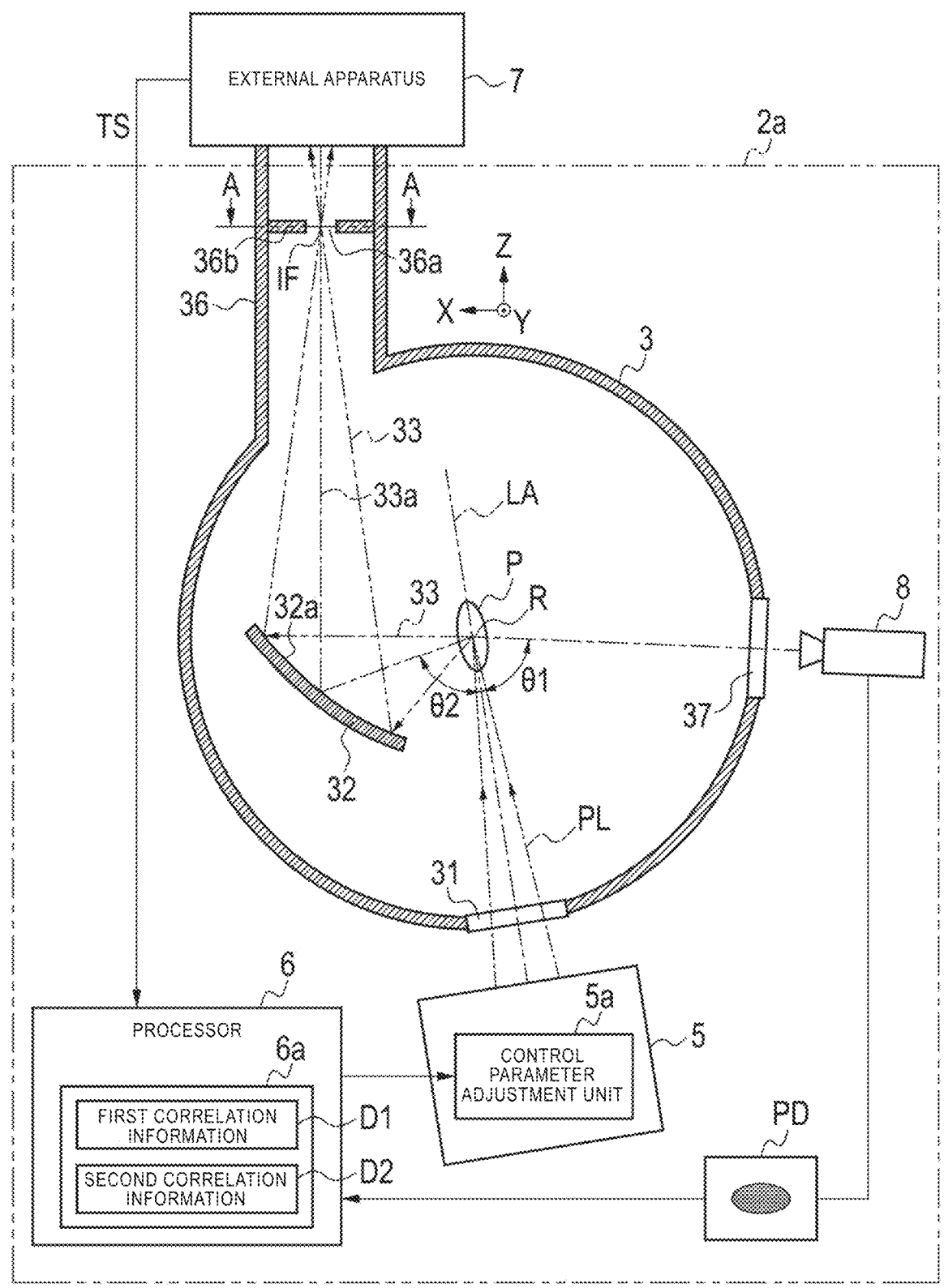
FIG. 23 is a view showing a modification of arrangement of a camera.

FIG. 23 shows a modification of the arrangement of the camera 8. As shown in FIG. 23, the camera 8 may be arranged such that an angle θ1 of the imaging direction of the camera 8 with respect to the laser optical axis LA is equal to an angle θ2 of the EUV light concentrating mirror 32 with respect to the laser optical axis LA. More specifically, the angle θ2 is an angle formed by the laser optical axis LA and a straight line connecting the center of the EUV light concentrating mirror 32 and the plasma generation region R. That is, the camera 8 may image the plasma generation region R from a direction axially symmetric to the EUV light concentrating mirror 32 with respect to the laser optical axis LA.

When the camera 8 is arranged as shown in FIG. 23, since the image of the plasma P imaged by the camera 8 coincides with the image of the plasma P viewed from the EUV light concentrating mirror 32, it is not necessary to create a virtual three-dimensional plasma when creating the first correlation information D1, and ray tracing calculation using the three-dimensional plasma is not necessary. Therefore, the correlation between the picture PD output from the camera 8 and the shape of the IF point profile can be easily obtained.

Further, the number of cameras 8 is not limited to one. A plurality of cameras 8 may be provided to image the plasma generation region R from a plurality of directions. By acquiring a plurality of images having different viewpoints as described above, the three-dimensional plasma can be accurately created. Accordingly, the first correlation information D1 can be created with higher accuracy.

Further, in the first to fifth embodiments, one of the delay time Δt, the PPL pulse energy Ep, the MPL pulse energy Em, the PPL pulse width Wp, and the MPL pulse width Wm is used as the control parameter for improving the circularity of the IF point profile. Alternatively, two or more of the delay time Δt, the PPL pulse energy Ep, the MPL pulse energy Em, the PPL pulse width Wp, and the MPL pulse width Wm may be used as control parameters for improving the circularity of the IF point profile.

Further, in the first to fifth embodiments, the value of the control parameter for improving the circularity of the IF point profile is obtained from the picture PD using the first correlation information D1 and the second correlation information D2, but the first correlation information D1 and the second correlation information D2 may be integrated as one piece of correlation information. The correlation information for obtaining the value of the control parameter for improving the circularity of the IF point profile from the picture PD is simply required to be information including the correlation between the shape of the plasma P and the control parameter.

8. Others

Figure 24:
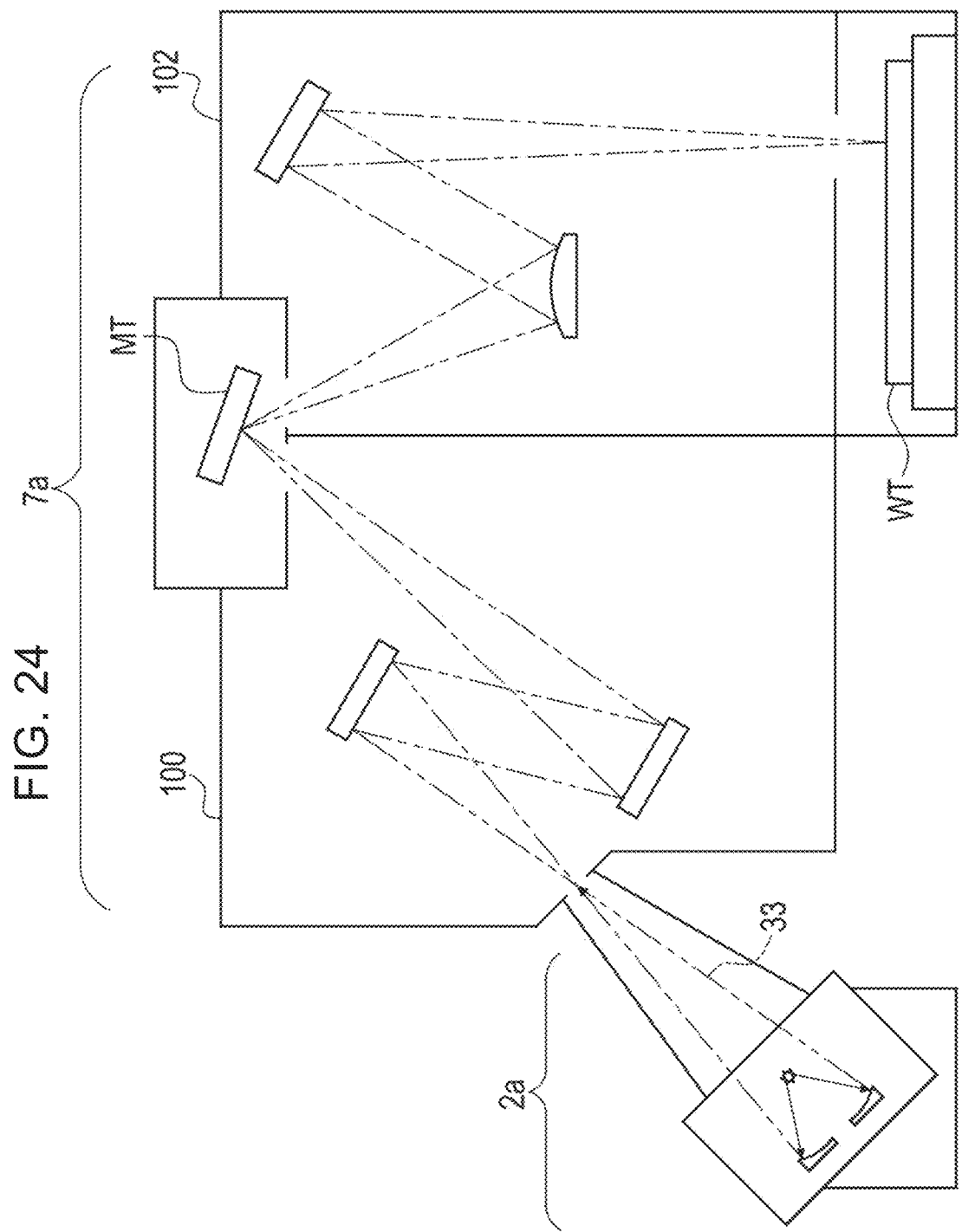
FIG. 24 is a diagram schematically showing the configuration of an exposure apparatus connected to the EUV light generation apparatus.

FIG. 24 schematically shows the configuration of an exposure apparatus 7a connected to the EUV light generation apparatus 2a. In FIG. 24, the exposure apparatus 7a as the external apparatus 7 includes a mask irradiation unit 100 and a workpiece irradiation unit 102. The mask irradiation unit 100 irradiates a mask pattern on a mask table MT via a reflection optical system with the EUV light 33 incident from the EUV light generation apparatus 2a. The workpiece irradiation unit 102 images the EUV light 33 reflected by the mask table MT onto a workpiece (not shown) placed on the workpiece table WT via a reflection optical system. The workpiece is a photosensitive substrate such as a semiconductor wafer on which photoresist is applied. The exposure apparatus 7a synchronously translates the mask table MT and the workpiece table WT to expose the workpiece to the EUV light 33 reflecting the mask pattern. Through the exposure process as described above, a device pattern is transferred onto the semiconductor wafer, thereby an electronic device can be manufactured.

Figure 25:
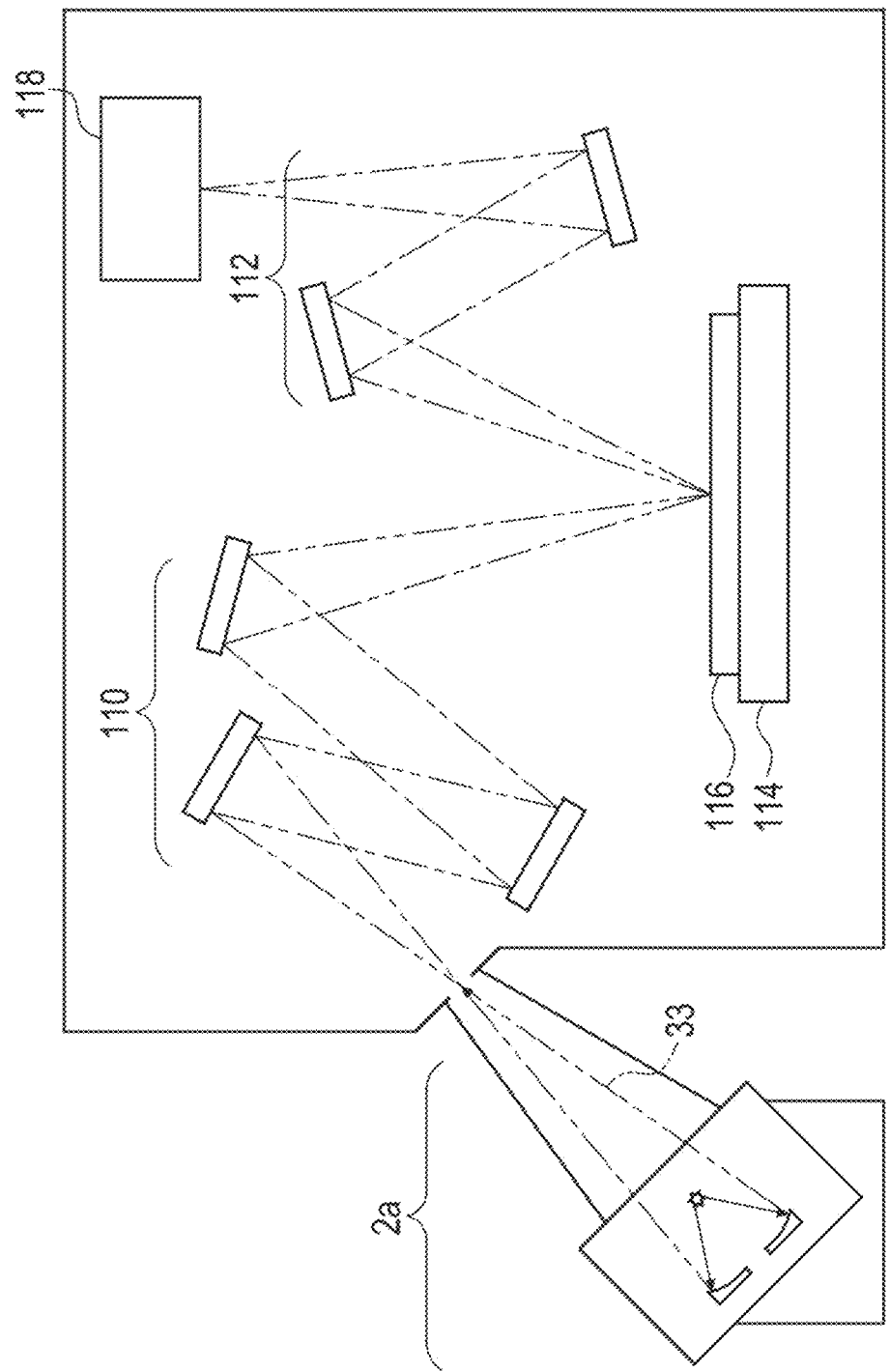
FIG. 25 is a diagram schematically showing the configuration of an inspection apparatus connected to the EUV light generation apparatus.

FIG. 25 schematically shows the configuration of an inspection apparatus 7b connected to the EUV light generation apparatus 2a. In FIG. 25, the inspection apparatus 7b as the external apparatus 7 includes an illumination optical system 110 and a detection optical system 112. The EUV light generation apparatus 2a outputs, as a light source for inspection, the EUV light 33 to the inspection apparatus 7b. The illumination optical system 110 reflects the EUV light incident from the EUV light generation apparatus 2a to illuminate a mask 116 placed on a mask stage 114. Here, the mask 116 conceptually includes a mask blanks before a pattern is formed. The detection optical system 112 reflects the EUV light 33 from the illuminated mask 116 and forms an image on a light receiving surface of a detector 118. The detector 118 having received the EUV light 33 acquires an image of the mask 116. The detector 118 is, for example, a time delay integration (TDI) camera. A defect of the mask 116 is inspected based on the image of the mask 116 acquired by the above-described process, and a mask suitable for manufacturing an electronic device is selected using the inspection result. Then, the electronic device can be manufactured by exposing and transferring the pattern formed on the selected mask onto the photosensitive substrate using the exposure apparatus 7a.

The description above is intended to be illustrative and the present disclosure is not limited thereto. Therefore, it would be obvious to those skilled in the art that various modifications to the embodiments of the present disclosure would be possible without departing from the spirit and the scope of the appended claims.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. An EUV light generation apparatus, comprising:
a chamber;
a target supply device configured to supply a first target into the chamber;
a laser device configured to output first pulse laser light to be incident on the first target, output second pulse laser light to be incident on a second target generated by the first pulse laser light being incident on the first target, and be capable of adjusting a control parameter correlated with a shape of plasma generated in a plasma generation region by the second pulse laser light being incident on the second target;
an EUV light concentrating mirror configured to reflect EUV light emitted from the plasma and concentrate the EUV light on an intermediate focal point;
a camera configured to image the EUV light emitted from the plasma and generate a picture including an image of the plasma; and
a processor configured to obtain a value of the control parameter for improving circularity of a profile of the EUV light at the intermediate focal point by using the picture and correlation information including a correlation between the shape of the plasma and the control parameter, and output the value of the control parameter to the laser device,
wherein the correlation information indicates a correlation among the shape of the plasma, a shape of the profile, and the control parameter,
wherein the shape of the plasma is defined, when the plasma is assumed to be a spheroid, as two-dimensional sizes of the plasma in the picture in two directions, and the shape of the profile is defined as two-dimensional sizes corresponding to the two directions of the plasma, and
wherein the processor measures the two-dimensional sizes of the plasma in the picture.

2. The EUV light generation apparatus according to claim 1,
wherein the correlation information includes first correlation information indicating a correlation between the shape of the plasma and the shape of the profile and second correlation information indicating a correlation between the shape of the plasma and the control parameter.

3. The EUV light generation apparatus according to claim 2,
wherein the processor measures the shape of the plasma based on the picture, estimates the shape of the profile by using the measured shape of the plasma and the first correlation information, and obtains a value of the control parameter by using the estimated shape of the profile, the first correlation information, and the second correlation information.

4. The EUV light generation apparatus according to claim 1,
wherein the control parameter is one or more of a delay time between the first pulse laser light and the second pulse laser light, a pulse energy of the first pulse laser light, a pulse energy of the second pulse laser light, a pulse width of the first pulse laser light, and a pulse width of the second pulse laser light.

5. The EUV light generation apparatus according to claim 1,
wherein the camera images the plasma generation region from a direction at an angle of 90° with respect to a laser optical axis of the first pulse laser light and the second pulse laser light.

6. The EUV light generation apparatus according to claim 5,
wherein the processor measures a diameter of the plasma and a length thereof in a direction of the laser optical axis as the two-dimensional sizes of the plasma.

7. The EUV light generation apparatus according to claim 6,
wherein the control parameter is a delay time between the first pulse laser light and the second pulse laser light, and
wherein the processor changes a length of the plasma in a direction of the laser optical axis by adjusting the delay time.

8. The EUV light generation apparatus according to claim 6,
wherein the control parameter is a pulse energy of the second pulse laser light, and
wherein the processor changes a length of the plasma in a direction of the laser optical axis by adjusting the pulse energy of the second pulse laser light.

9. The EUV light generation apparatus according to claim 6,
wherein the control parameter is a pulse width of the second pulse laser light, and
wherein the processor changes a length of the plasma in a direction of the laser optical axis by adjusting the pulse width of the second pulse laser light.

10. The EUV light generation apparatus according to claim 6,
wherein the control parameter is a pulse energy of the first pulse laser light, and
wherein the processor changes a length of the plasma in a direction of the laser optical axis by adjusting the pulse energy of the first pulse laser light.

11. The EUV light generation apparatus according to claim 6,
wherein the control parameter is a pulse width of the first pulse laser light, and
wherein the processor changes a length of the plasma in a direction of the laser optical axis by adjusting the pulse width of the first pulse laser light.

12. The EUV light generation apparatus according to claim 1,
wherein the camera images the plasma generation region from a direction axially symmetric to the EUV light concentrating mirror with respect to a laser optical axis of the first pulse laser light and the second pulse laser light.

13. The EUV light generation apparatus according to claim 1,
wherein the EUV light concentrating mirror has a part of a spheroidal surface as a reflection surface having a first focal point located in the plasma generation region and a second focal point located at the intermediate focal point.

14. The EUV light generation apparatus according to claim 13,
wherein the EUV light concentrating mirror is an off-axis mirror having the reflection surface that is a part of the spheroidal surface, the part being off a rotational symmetry axis thereof and is asymmetric with respect to the rotational symmetry axis.

15. The EUV light generation apparatus according to claim 1,
   wherein the spheroid has a rotational symmetry axis which is a laser optical axis of the first pulse laser light and the second pulse laser light, and
   wherein the two-dimensional sizes of the plasma are a length thereof in a direction of the laser optical axis and a diameter thereof in a plane perpendicular to the laser optical axis.

16. The EUV light generation apparatus according to claim 1,
   wherein the camera includes a fluorescent plate that generates visible light in response to the EUV light and an image sensor that two-dimensionally images the visible light generated by the fluorescent plate.

17. An electronic device manufacturing method, comprising:
   outputting EUV light generated by an EUV light generation apparatus to an exposure apparatus; and
   exposing a photosensitive substrate to the EUV light in the exposure apparatus to manufacture an electronic device, the EUV light generation apparatus including:
   a chamber;
   a target supply device configured to supply a first target into the chamber;
   a laser device configured to output first pulse laser light to be incident on the first target, output second pulse laser light to be incident on a second target generated by the first pulse laser light being incident on the first target, and be capable of adjusting a control parameter correlated with a shape of plasma generated in a plasma generation region by the second pulse laser light being incident on the second target;
   an EUV light concentrating mirror configured to reflect the EUV light emitted from the plasma and concentrate the EUV light on an intermediate focal point;
   a camera configured to image the EUV light emitted from the plasma and generate a picture including an image of the plasma; and
   a processor configured to obtain a value of the control parameter for improving circularity of a profile of the EUV light at the intermediate focal point by using the picture and correlation information including a correlation between the shape of the plasma and the control parameter, and output the value of the control parameter to the laser device,
   wherein the correlation information indicates a correlation among the shape of the plasma, a shape of the profile, and the control parameter,
   wherein the shape of the plasma is defined, when the plasma is assumed to be a spheroid, as two-dimensional sizes of the plasma in the picture in two directions, and the shape of the profile is defined as two-dimensional sizes corresponding to the two directions of the plasma, and
   wherein the processor measures the two-dimensional sizes of the plasma in the picture.

18. An electronic device manufacturing method, comprising:
   inspecting a defect of a mask by irradiating the mask with EUV light generated by an EUV light generation apparatus;
   selecting a mask using a result of the inspection; and
   exposing and transferring a pattern formed on the selected mask onto a photosensitive substrate, the EUV light generation apparatus including:
   a chamber;
   a target supply device configured to supply a first target into the chamber;
   a laser device configured to output first pulse laser light to be incident on the first target, output second pulse laser light to be incident on a second target generated by the first pulse laser light being incident on the first target, and be capable of adjusting a control parameter correlated with a shape of plasma generated in a plasma generation region by the second pulse laser light being incident on the second target;
   an EUV light concentrating mirror configured to reflect the EUV light emitted from the plasma and concentrate the EUV light on an intermediate focal point;
   a camera configured to image the EUV light emitted from the plasma and generate a picture including an image of the plasma; and
   a processor configured to obtain a value of the control parameter for improving circularity of a profile of the EUV light at the intermediate focal point by using the picture and correlation information including a correlation between the shape of the plasma and the control parameter, and output the value of the control parameter to the laser device,
   wherein the correlation information indicates a correlation among the shape of the plasma, a shape of the profile, and the control parameter,
   wherein the shape of the plasma is defined, when the plasma is assumed to be a spheroid, as two-dimensional sizes of the plasma in the picture in two directions, and the shape of the profile is defined as two-dimensional sizes corresponding to the two directions of the plasma, and
   wherein the processor measures the two-dimensional sizes of the plasma in the picture.

* * * * *